United States Patent
Miyagawa

(10) Patent No.: US 7,868,909 B2
(45) Date of Patent: Jan. 11, 2011

(54) METHOD AND APPARATUS FOR MULTI-BEAM EXPOSURE

(75) Inventor: Ichirou Miyagawa, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 1519 days.

(21) Appl. No.: 11/224,985

(22) Filed: Sep. 14, 2005

(65) Prior Publication Data

US 2006/0060798 A1    Mar. 23, 2006

(30) Foreign Application Priority Data

| Sep. 17, 2004 | (JP) | ............................. 2004-272388 |
| Sep. 17, 2004 | (JP) | ............................. 2004-272389 |
| Sep. 17, 2004 | (JP) | ............................. 2004-272391 |

(51) Int. Cl.
    *B41J 2/47* (2006.01)
(52) U.S. Cl. ...................................... 347/239; 347/255
(58) Field of Classification Search ............... 347/229, 347/234, 239, 248, 255, 116, 249
    See application file for complete search history.

(56) References Cited

U.S. PATENT DOCUMENTS

| 6,124,876 | A  | * | 9/2000  | Sunagawa ................... 347/239 |
| 6,486,938 | B1 | * | 11/2002 | Morita et al. ................. 355/32 |
| 2003/0169467 | A1 | * | 9/2003  | Miyagawa ................... 358/509 |
| 2003/0219189 | A1 |   | 11/2003 | Ishikawa et al. |
| 2004/0184119 | A1 |   | 9/2004  | Nakaya et al. |

FOREIGN PATENT DOCUMENTS

| EP | 1369731     | 12/2003 |
| EP | 1376194     | 1/2004  |
| JP | 2004-233718 | 8/2004  |

* cited by examiner

*Primary Examiner*—Hai C Pham
(74) *Attorney, Agent, or Firm*—Sheldon J. Moss; Chad M. Herring

(57) ABSTRACT

A multi-beam exposure apparatus of the present invention includes a two-dimensional light modulator which is configured to project plural exposure beam spots onto an exposure surface, the plural exposure beam spots being arranged in parallel with the scanning direction while two-dimensionally arrayed; and a pixel block shifting member which divides the plural beam spots into plural blocks in the scanning direction and projects the plural exposure beam spots onto the exposure surface by shifting a relative position between the blocks in a direction orthogonal to a scanning direction, and thereby the scan-exposing of a space between the exposure beam spots in the direction orthogonal to the scanning direction is performed with the exposure beam spot of another block. According to the multi-beam exposure apparatus, the number of dots which can simultaneously be exposed in the direction orthogonal to the scanning direction can be increased.

18 Claims, 18 Drawing Sheets

US 7,868,909 B2

METHOD AND APPARATUS FOR MULTI-BEAM EXPOSURE

CROSS-REFERENCE TO RELATED APPLICATION

This application claims priority under 35 USC 119 from Japanese Patent Application Nos. 2004-272388, 2004-272389 and 2004-272391, the disclosures of which are incorporated by reference herein.

BACKGROUND OF THE INVENTION

1. Field of the Invention

The present invention relates to a multi-beam exposure method and an apparatus thereto in which exposure is performed with a predetermined pattern by focusing a light beam for each single pixel with an optical element to irradiate a recording medium, the light beam being emitted from a spatial light modulation element (two-dimensional light modulator) or the like which is a means for selectively turning on and off the plural pixels arranged in an exposure head in accordance with the image data (pattern data).

2. Description of the Related Art

Recently, multi-beam exposure apparatuses are being developed, in which a spatial light modulation element (two-dimensional light modulator) such as a digital micromirror device (DMD) is used as a pattern generator to perform image exposure on a recording medium such as a planographic printing plate with the light beam modulated according to image data. Because the spatial light modulation element (two-dimensional light modulator) has a configuration in which the pixels for modulating incident light are two-dimensionally arrayed, the spatial light modulation element has an advantage that a spatially incoherent light source such as a lamp can also be used with the spatial light modulation element.

Depending on the method of using the spatial light modulation element (two-dimensional light modulator), light power per unit pixel can be reduced in the spatial light modulation element when compared with a one-dimensional light modulator in which the pixels are one-dimensionally arrayed, and the life of the spatial light modulation element can be lengthened. Therefore, it is expected that such a spatial light modulation element will be widely used for multi-beam exposure apparatuses.

A DMD is a mirror device in which many micromirrors are two-dimensionally arrayed on a semiconductor substrate such as silicon. In the micromirror, for example, an angle of a reflection plane is changed according to a control signal. The micromirror is configured to change the angle of the reflection plane using the electrostatic force of an electrical charge accumulated in each memory cell.

In a multi-beam exposure apparatus in which a DMD is used, a laser beam emitted from a light source is collimated by a lens system and reflected by the plural micromirrors in the DMD arranged at substantially the focal position of the lens system. Therefore, the light beams two-dimensionally modulated and emitted are focused for each single pixel by the lens system to form a spot having a small diameter on an exposure surface of a recording medium (planographic printing plate) which is a photosensitive material, effecting imagewise exposure.

Namely, in this multi-beam exposure apparatus, each of the micromirrors in the DMD is on/off-controlled by a control device (not shown) based on the control signal generated according to the image data or the like, the laser beam is modulated (deflected), and the exposure is performed by irradiating the exposure surface with the modulated laser beam.

In this multi-beam exposure apparatus, the planographic printing plate or the like is placed on a recording surface, and the DMD is modulated according to the image data while the position of the beam spot is moved relative to the planographic printing plate, with the image of the beam spot being formed on the planographic printing plate by irradiating the planographic printing plate with the laser beams emitted from the plural exposure heads provided in the exposure apparatus. Therefore, the multi-beam exposure apparatus can perform a process of exposing a pattern on the planographic printing plate. Further, the recording medium such as the planographic printing plate into which the image has been recorded is subject to automatic development by an automatic developing machine if necessary, and a latent image formed in the recording medium such as the planographic printing plate is converted into a visual image.

Conventionally, in DMD used for such multi-beam exposure apparatuses, the micromirrors are arrayed in m rows in a scanning direction and n columns in a direction orthogonal to the scanning direction. Further, in such a DMD, the rows of the pixels are arranged so as to be inclined at a predetermined angle relative to the scanning direction of the exposure head, so that (m/N−1) dots can be formed between scanning lines by performing multiple exposures N-times at staggered time intervals in the scanning direction.

Thus, it is proposed that a dot pitch is changed by adjusting the number of multiple-exposure times in the scanning direction, to increase addressability in the direction orthogonal to the scanning direction (for example, Japanese Patent Laid-Open Publication No. 2004-62156).

However, in such a multi-beam exposure apparatus, when the rows of the pixels of the DMD are arranged so as to be inclined at the predetermined angle relative to the scanning direction of the exposure head to perform recording, by a multiple-exposure method at staggered time intervals in the scanning direction, one dot is formed on the planographic printing plate by performing multiple exposures N-times at staggered time intervals for pixels which are inclined relative to a main scanning line. At this point, in the planographic printing plate, a position of each beam spot in which the multiple exposures are performed in order to record one dot is shifted in a sub-scanning direction. Therefore, an exposure amount distribution in the recorded dot extends in the sub-scanning direction, and the recorded dot is formed as a blurred image in the sub-scanning direction.

In the conventional multi-beam exposure apparatus in which the image exposure is performed onto the planographic printing plate, when the image exposure is performed onto the planographic printing plate to express a halftone, usually the halftone is expressed with a dot shape (a so-called micro-checkered pattern) by utilizing an AM screen (a technique of forming a gray-scale image by a dot image). Namely, in the AM screen, the minimum-unit of halftone dot image is formed by a relatively large number of dots such as 196 dots of 14 (the number of dots in the horizontal direction) by 14 (the number of dots in the vertical direction), and the gray-scale image is recorded by recording the dot images while arranging the dot images in a two-dimensional plane. However, when the halftone is expressed by utilizing the AM screen, sometimes a moiré pattern or a tone jump is generated.

As a method to form a gradation image using a dot image, there is an FM screen technique of forming the gray-scale image by dot images. An FM screen expresses the gray scale of the recording image by the cumulative density of irregular patterned-dots having no regularity. For example, in an FM screen, the images formed by a relatively small number of dots such as a total of four dots of two by two are dispersed in the two-dimensional plane to perform the gray-scale expression. An FM screen has the advantage that the generation of a moiré pattern or the like can, in principle, be suppressed.

Therefore, in a conventional multi-beam exposure apparatus in which the image exposure is performed onto a recording medium such as a planographic printing plate, it is desired that the halftone be formed in a small dot shape using an FM screen.

However, in a multi-beam exposure apparatus, when the rows of pixels of the DMD are arranged so as to be inclined at a predetermined angle relative to the scanning direction of the exposure head to perform recording by the N-times multiple-exposure method at staggered time intervals in the scanning direction when performing the multiple exposures in order to record one dot on the recording medium such as the planographic printing plate, the position of the plural beam spots in which the multiple exposures are performed are shifted in the sub-scanning direction relative to the same exposure point which should be formed into one dot, and the exposure amount distribution in the recorded dot extends in the sub-scanning direction. Therefore, sometimes the recorded dot is formed as a blurred image in the sub-scanning direction.

In an image in which the exposures are performed to record the FM screen, when each dot is thus recorded as a blurred shape in the sub-scanning direction, that is, under conditions in which the edge cannot be kept sharp, even a slight change in the circumferential length of the recording pixel generated depending on the recording conditions such as a light power fluctuation and the number of prints or development conditions such as a degree of development of an automatic developing machine could cause a rapid change in a dot-image ratio (dot-coverage ratio characteristic), resulting in a change in image density. Therefore, there is a problem that an FM screen is difficult to use in conventional multi-beam exposure apparatuses which adopt the method in which the rows of the pixels of a DMD are arranged so as to be inclined at a predetermined angle relative to the scanning direction of the exposure head to perform recording by the N-times multiple-exposure method at staggered time intervals in the scanning direction.

SUMMARY OF THE INVENTION

In view of the foregoing problems, an object of the present invention is to provide a multi-beam exposure method and apparatus thereto which can increase the number of dots (the number of beam spots) which can be simultaneously exposed in a direction orthogonal to the scanning direction and record a stable halftone expression using an FM screen when performing the exposure process with a means for selectively turning on and off the plural pixels of a DMD which is a two-dimensional light modulator.

A first aspect of the present invention is to provide a multi-beam exposure method which is performed by means for selectively turning on and off plural pixels, the multi-beam exposure method comprising: dividing plural exposure beam spots into plural blocks with respect to a scanning direction, the plural exposure beam spots being projected onto an exposure surface from the means for selectively turning on and off the plural pixels such that the plural exposure beam spots are arranged in parallel with the scanning direction; and effecting scan-exposing in a state in which a relative position between blocks is shifted in a direction orthogonal to the scanning direction such that the exposure beam spots of each block being projected onto the exposure surface are not aligned between blocks when viewed along the scanning direction.

According to the multi-beam exposure method of the first aspect, one dot can be recorded by performing multiple exposures with the plural exposure beam spots which are projected onto the exposure surface from the means for selectively turning on and off the plural pixels, the plural exposure beam spots being arranged in the scanning direction within one block while the exposure is performed by one block.

Accordingly, the positions (in the scanning direction) of the beam spots at which the multiple exposures are performed in order to record one dot can accurately align with one another to prevent the spread of the exposure amount distribution (in the direction orthogonal to the scanning direction) in one dot. Further, the FM screen can be recorded with dots having sharp edges by keeping the edge of the recorded dot sharp.

As a result, a change in density, which is generated by a rapid change in the dot-image ratio (dot-coverage ratio characteristic) due to a change in the circumferential length of the recording pixels, can be prevented, and a stable halftone expression can be recorded using the FM screen. The change in the circumferential length of the recording pixel is caused depending on the recording conditions such as light power fluctuation and the number of prints or the development conditions such as the degree of development of the automatic developing machine.

Further, the number of dots (the number of beam spots) which can simultaneously be exposed in the direction orthogonal to the scanning direction can be increased.

In a second aspect of the invention, a multi-beam exposure method in which a two-dimensional light modulator is used, with pixels for modulating light being two-dimensionally arrayed in the two-dimensional light modulator, the multi-beam exposure method comprising: dividing a plurality of two-dimensionally arrayed exposure beam spots into a plurality of blocks with respect to a scanning direction, the plurality of two-dimensionally arrayed exposure beam spots being projected onto an exposure surface from the two-dimensional light modulator such that the plurality of exposure beam spots are arranged in parallel with the scanning direction; and effecting scan-exposing in a state in which a relative position between blocks is shifted in a direction orthogonal to the scanning direction such that exposure of a space in the direction orthogonal to the scanning direction between the exposure beam spots is carried out with the exposure beam spot of another block.

According to the multi-beam exposure method of the second aspect of the present invention, the dots can be recorded two-dimensionally by performing the multiple exposures in each line with the exposure beam spots which are projected onto the exposure surface from the two-dimensional light modulator, the exposure beam spots being arranged in plural lines in the scanning direction and the exposure being performed in block units.

Therefore, the positions (in the scanning direction) of the beam spots to which the multiple exposures are performed in order to record one dot can be accurately aligned with one another. Namely, the spread of the exposure amount distribution (in the direction orthogonal to the scanning direction) in one dot can be prevented to keep the edge of the recorded dot sharp.

As a result, since the FM screen can be recorded with the dots having sharp edges, the change in density which is generated by the rapid change in the dot-image ratio (dot-coverage ratio characteristic) due to a change in the circumferential length of the recording pixel can be prevented, and a stable halftone expression can be recorded using the FM screen. The change in the circumferential length of the recording pixel is caused by the recording conditions such as light power fluctuation and the number of prints, or the development conditions such as the degree of development of the automatic developing machine.

Further, the number of dots (the number of beam spots) which can simultaneously be exposed in the direction orthogonal to the scanning direction can be increased. Therefore, when the beam spot is projected onto the exposure surface from the two-dimensional light modulator utilizing a magnifying optical system, the exposure area is enlarged and the scanning process speed for the recording medium can be improved, which allows efficiency of the exposure process to be improved.

When the exposure process is performed with the pitch between the adjacent beam spots reduced in the direction orthogonal to the scanning direction when projecting the beam spot onto the exposure surface with the two-dimensional light modulator, the so-called addressability (positional resolution) can be increased.

In a third aspect of the present invention, a multi-beam exposure apparatus comprising: a two-dimensional light modulator which is configured to project a plurality of exposure beam spots onto an exposure surface, the plurality of exposure beam spots being arranged in parallel with the scanning direction while arrayed two-dimensionally; and a pixel block shifting member which projects a plurality of exposure beam spots onto the exposure surface, with dividing the plurality of exposure beam spots emitted from the two-dimensional light modulator into a plurality of blocks in the scanning direction and shifting a relative position between blocks in a direction orthogonal to a scanning direction, and thereby scan-exposing a space in the direction orthogonal to the scanning direction between the exposure beam spots is performed with the exposure beam spot of another block.

In a fourth aspect of the present invention, the pixel block shifting member has at least a first transparent flat-plate optical member and a second transparent flat-plate optical member, the first optical member is configured to be arranged inclined at a predetermined angle relative to an optical axis of the exposure beams, and thereby a group of the exposure beams are refracted and divided-off into a plurality of blocks and the group of exposure beams are projected onto the exposure surface while shifted in the direction orthogonal to the scanning direction, and the second optical member is arranged to be orthogonal to the optical axis of the exposure beams while being adjacent to the first optical member in the scanning direction on an optical path of the exposure beams.

In a fifth aspect of the present invention, the pixel block shifting member has at least a first transparent flat-plate optical member and a second transparent flat-plate optical member, the first optical member is configured to be positioned inclined at a first predetermined angle relative to the optical axis of the exposure beams, and thereby a first group of the exposure beams are refracted and divided-off into a first block and the first group of exposure beams are projected onto the exposure surface while shifted in a first direction orthogonal to the scanning direction, and the second optical member is configured to be positioned inclined at a second predetermined angle relative to the optical axis of the exposure beams, and thereby a second group of exposure beams are refracted and divided-off into a second block and the second group of the exposure beams is projected onto the exposure surface while shifted in a second direction orthogonal to the scanning direction.

In a sixth aspect of the present invention, the pixel block shifting member has at least one diffraction member and a transparent unit, the transparent unit being arranged adjacent to the diffraction member in the scanning direction on the optical path of the exposure beams, the diffraction member is configured to diffract a group of the exposure beams and divide-off the group of the exposure beams into at least one block, and thereby the group of exposure beams are projected onto the exposure surface while shifted in a direction orthogonal to the scanning direction, and the transparent unit is configured to transmit some of the exposure beams along a linear optical path.

In a seventh aspect of the present invention, the pixel block shifting member has a first diffraction member and a second diffraction member, the first diffraction member is configured to diffract a first group of exposure beams and divides-off the group of the exposure beams into a first block, such that the first group of the exposure beams are projected onto the exposure surface while shifted in a direction orthogonal to the scanning direction, and the second diffraction member is configured to diffract a second group of the exposure beams and divides-off the second group of the exposure beams into a second block, such that the second group of exposure beams are projected onto the exposure surface while shifted in the opposite direction orthogonal to the scanning direction.

In an eighth aspect of the present invention, the pixel block shifting member has at least one polarization unit and the transparent unit, the transparent unit being positioned adjacent to the polarization unit in the scanning direction on the optical path of the exposure beams, the polarization unit is configured to transmit a group of the exposure beams and divides-off the group of the exposure beams into at least one block, and thereby extraordinary rays are projected onto the exposure surface, the extraordinary rays being emitted while shifted in the direction orthogonal to the scanning direction, and the transparent unit is configured to transmit some of the exposure beams along a linear optical path.

In a ninth aspect of the present invention, the pixel block shifting member has a first polarization unit and a second polarization unit, the first polarization unit is configured to transmit a first group of the exposure beams and divides-off the first group of the exposure beams into a block, and thereby the extraordinary rays are projected onto the exposure surface, the extraordinary ray being emitted while shifted in a direction orthogonal to the scanning direction, and the second polarization unit is configured to transmit a second group of the exposure beams and divides-off the second group of the exposure beams into a second block, and thereby other extraordinary rays are projected onto the exposure surface, these extraordinary rays being emitted while shifted in the opposite direction orthogonal to the scanning direction.

According to the multi-beam exposure apparatus of the present invention having the above configurations, multiple exposures can be performed to two-dimensionally record the dots at each line by projecting each of the exposure beam spots onto the exposure surface, the exposure beam spots being arranged in plural lines in the scanning direction and the exposure being performed in block units by the two-dimensional light modulator.

Therefore, the positions of the beam spots to which the multiple exposures are performed in order to record each dot can be accurately aligned with one another, and the spread of the exposure amount distribution in one dot can be prevented, which allows the FM screen to be recorded while the edge of the recorded dot is kept sharp.

As a result, a change in density, which is generated by the rapid change in the dot-image ratio (dot-coverage ratio characteristic) due to a change in the circumferential length of the recording pixel, can be prevented, and a stable halftone expression can be recorded using the FM screen. The change in the circumferential length of the recording pixel is caused by the recording conditions such as light power fluctuation and the number of prints or the development conditions such as the degree of development of the automatic developing machine.

Further, the number of dots (the number of beam spots) which can simultaneously be exposed in the direction orthogonal to the scanning direction can be increased. Therefore, when the beam spot is projected onto the exposure surface from the two-dimensional light modulator by utilizing a magnifying optical system for example, the exposure area is enlarged and the scanning process speed to the recording medium is improved, which allows the efficiency of the exposing process to be improved.

When the exposure process is performed with the pitch between the adjacent beam spots reduced in the direction orthogonal to the scanning direction when projecting the beam spot onto the exposure surface with the two-dimensional light modulator, the so-called addressability (positional resolution) can be increased.

In a tenth aspect of the present invention, the multi-beam exposure apparatus based on the third aspect of the present invention further comprising a uniaxial crystal optical element which is arranged in (an optical projection system of) the multi-beam exposure apparatus between the pixel block shifting member and the exposure surface, the uniaxial crystal optical element forming a beam spot shape by separating the exposure beams into an ordinary ray and an extraordinary ray with light quantities of the ordinary ray and the extraordinary ray being approximately equal to each other, such that two beam spots are arranged in the direction orthogonal to the scanning direction while being adjacent to each other so as to partially overlap each other in the beam spot shape.

In the multi-beam exposure apparatus of the tenth aspect, the effects of the multi-beam exposure apparatus of the third aspect are of course obtained. In addition, according to the multi-beam exposure apparatus of the tenth aspect, the light beams are separated into the ordinary rays and the extraordinary rays when the plural light beams are transmitted through the uniaxial crystal optical element arranged on the optical path from the pixel block shifting member to the exposure surface. The intensity of the ordinary ray is equal to the intensity of the extraordinary ray, and the ordinary ray and the extraordinary ray are separated from each other in the direction (sub-scanning direction) orthogonal to the scanning direction.

The ordinary ray and the extraordinary ray, which are separated in the sub-scanning direction while having the same intensity, have an approximately rectangular distribution with respect to the sub-scanning direction at the focal point on the recording medium, and the ordinary ray and the extraordinary ray are focused at the beam spot whose edge portion becomes sharply formed.

In the multi-beam exposure apparatus of the tenth aspect, the beam spot has an approximately rectangular distribution due to the beam division, the edge portion of the beam spot being sharply formed by the beam division, and the exposure process is performed while a longitudinal direction of the approximately rectangular distribution is set to be parallel with the scanning direction. Therefore, the beam-spot intensity distribution on the recording medium becomes an approximately rectangular shape in the sub-scanning direction, and the edges of both sides of the focal point become sharpened. Accordingly, image unevenness in the sub-scanning direction is favorably suppressed with almost no influence from fluctuations in the coloring threshold of the recording medium or fluctuations in the intensity of the laser beam.

As a result, the image recorded in the FM screen can be set such that a change in the circumferential length of the recording pixel is not changed by the recording conditions such as light power fluctuation and the number of prints, or the development conditions such as the degree of development of the automatic developing machine. Accordingly, a rapid change in the dot-image ratio (dot-coverage ratio characteristic) is prevented, and thus a change in density is hardly generated, which allows a stable halftone expression to be recorded when the FM screen is used.

In an eleventh aspect of the present invention, the pixel block shifting member is formed as an optical element utilizing light polarization, and a polarization adjuster is further provided between the pixel block shifting member and the uniaxial crystal optical element, the polarization adjuster causing the ordinary ray and the extraordinary ray to be emitted from the uniaxial crystal optical element with substantially equal light quantities.

According to the multi-beam exposure apparatus of the eleventh aspect, the polarized direction of the light beam is made uniform by transmitting the light beam through the uniaxial crystal optical element which is formed as the optical element utilizing light polarization, and the light beam is caused to be incident to the uniaxial crystal optical element after the light beam is converted into a predetermined polarization state, such as circularly polarized light, by a polarization adjusting means such as a quarter-wave plate. Therefore, when the plural light beams are transmitted through the uniaxial crystal optical element, each of the light beams can be separated into the ordinary ray and the extraordinary ray to perform an appropriate exposure process.

In a twelfth aspect of the present invention, a multi-beam exposure apparatus based on the third aspect of the invention further comprising an optical projection system and an aperture which is arranged in the optical projection system, the optical projection system focusing the plurality of exposure beams onto the exposure surface, the plurality of exposure beams being emitted from the two-dimensional light modulator, the aperture being formed as an opening which at least restricts light extending in the direction orthogonal to the scanning direction, i.e. in a sub-scanning direction in each beam spot, the beam spot being focused onto the exposure surface.

As described above, according to the multi-beam exposure method and apparatus thereto of the present invention, when the exposure process is performed with the means for selectively turning on and off the plural pixels of the DMD which is the two-dimensional light modulator, the number of dots (the number of beam spots) which can be simultaneously exposed in the direction orthogonal to the scanning direction can be increased, and a stable halftone expression can be recorded using the FM screen.

DETAILED DESCRIPTION OF THE INVENTION

Referring to FIGS. 1 to 11, a multi-beam exposure method and apparatus thereto according to a first embodiment of the present invention will be described below.

Figure 11:
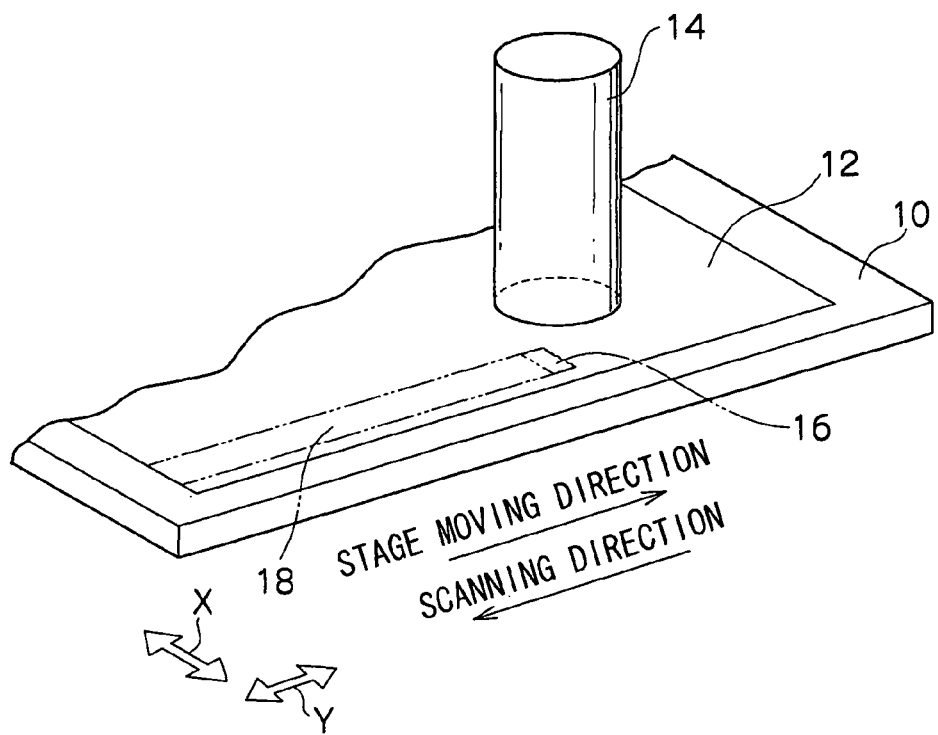
FIG. 11 is a perspective view showing the main parts performing an exposure process using the exposure head.

An image forming apparatus (not shown) which is the multi-beam exposure apparatus according to the first embodiment of the present invention is formed in a so-called flat-bed type of image forming apparatus (setter) which is controllably driven by a control unit. Specifically, as shown in FIG. 11, a recording medium 12 which is a planographic printing plate (presensitized plate) or the like is placed on a moving stage 10, and the recording medium 12 is moved in a main scanning direction by the moving stage 10. While the recording medium 12 is moving in the main scanning direction, multi-beams emitted from the light source side are spatially modulated by an exposure head 14 based on a modulating signal generated from image data by a control unit, and an exposure process is performed by irradiating the recording medium 12 with the multi-beams.

For example, an exposure area 16 exposed by the exposure head 14 is formed in a rectangular shape whose short side becomes a feeding direction (main scanning direction). In this case, as a result of a scanning exposure, a band-shaped exposed area 18 is formed in the recording medium 12. In the image forming apparatus (setter), it is also possible that the plural exposure heads 14 are arrayed in an approximately m by n matrix (for example, two rows by four columns) so the exposure process is simultaneously performed by plural exposure heads 14 (for example, eight exposure heads).

Figure 1:
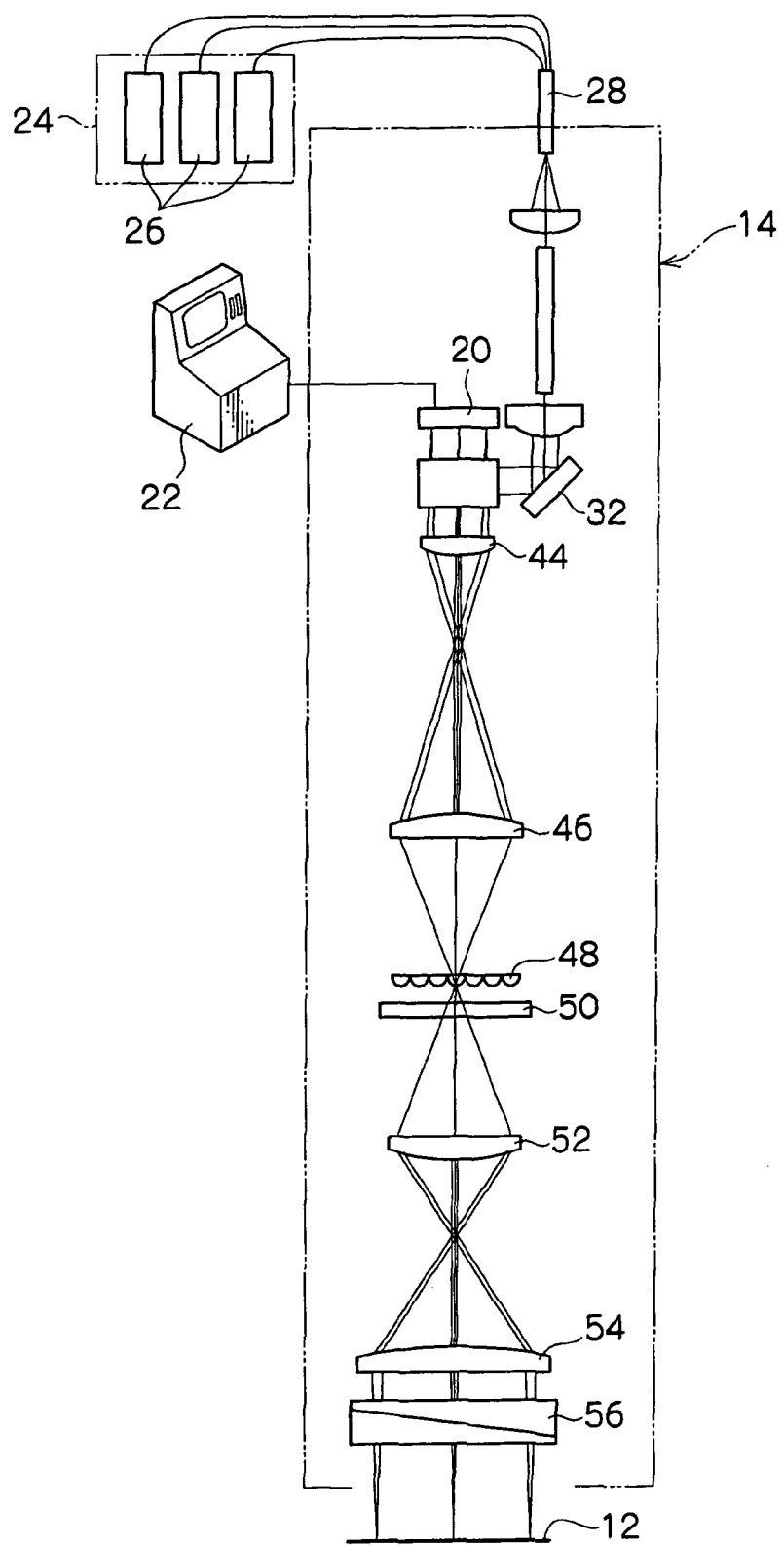
FIG. 1 is a schematic view showing an exposure head unit of a multi-beam exposure apparatus of a first embodiment according to the multi-beam exposure method and apparatus of the present invention.

As shown in FIG. 1, the exposure head 14 includes a digital micromirror device (DMD) 20 as the spatial light modulation element (two-dimensional light modulator). The DMD 20 modulates an incident light beam in each pixel according to the image data. The DMD 20, which is the two-dimensional light modulator, is driven and controlled by a control unit (control means) 22. The control unit 22 includes data processing means and mirror drive control means.

A data processing unit of the control unit 22 generates a control signal based on the inputted image data. The control signal drives and controls each micromirror within an area of the DMD 20 to be controlled in the exposure head 14 (the control signal controls the angle of a reflection plane of each micromirror).

A bundle optical fiber 28 is connected to a light incident side of the DMD 20 in the exposure head 14. The bundle optical fiber 28 is drawn out from a light source unit 24. The light source unit 24 is a lighting unit that emits the multi-beams as laser beams.

Plural optical multiplexing modules 26 are arranged in the light source unit 24. The optical multiplexing module 26 inputs the laser beam into the optical fiber by multiplexing the laser beam, such as an ultraviolet light or the like, emitted from plural laser diode chips. The optical fiber extending from each optical multiplexing module 26 is the multiplexing optical fiber through which the multiplexed laser beam propagates. In the plural multiplexing optical fibers, in order to increase the intensity of the outgoing laser beam, the plural optical fibers are tied in the bundle to form the bundled optical fiber (fiber bundle) 28.

A lighting system is arranged at the light incident side of the DMD 20 in the exposure head 14. The lighting system includes a mirror 32, and the laser beam emitted from a connecting end portion of the bundle optical fiber 28 passes through an optical lens such as a rod lens and is reflected from the mirror 32 toward the DMD 20.

Figure 10:
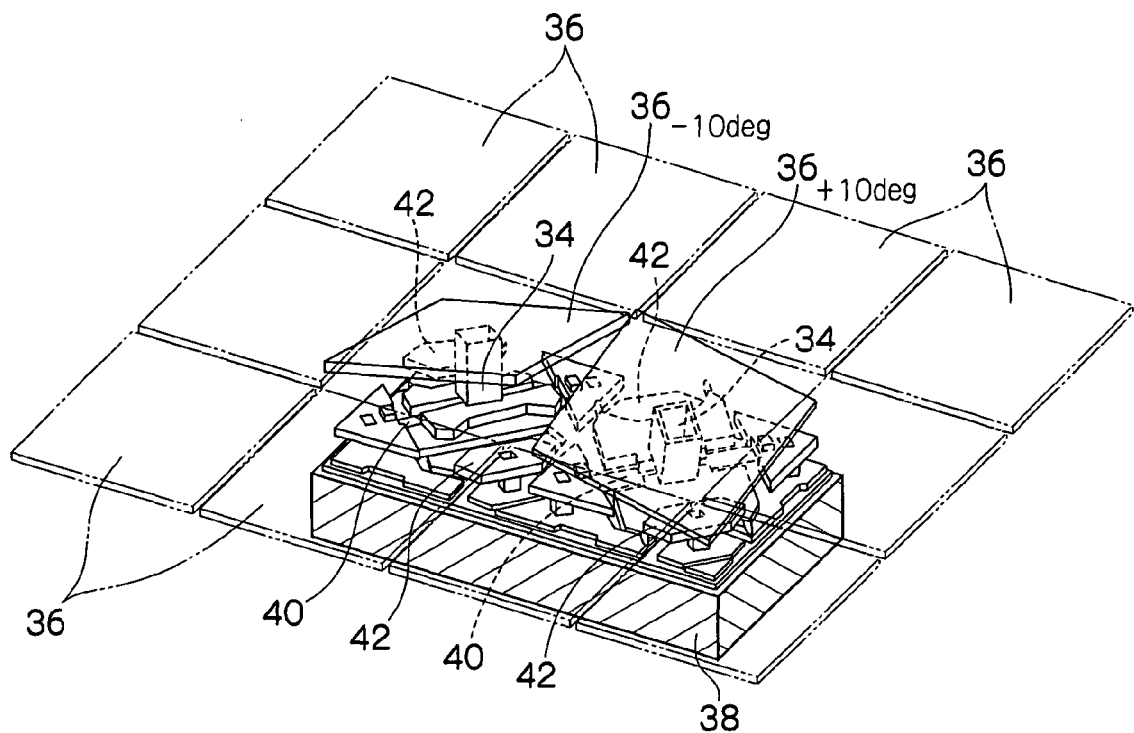
FIG. 10 is a perspective view showing a schematic configuration of a DMD used in the exposure head.

As shown in FIG. 10, the whole DMD 20 is formed in a monolithic structure as a mirror device. In this mirror device, multiple micromirrors 36 (for example, 600 by 800 pieces) forming the pixels are arrayed in a lattice shape.

A material, such as aluminum or the like, having high reflectance is vapor deposited onto the surface of the micromirrors 36, which are installed in the uppermost portion of each pixel. In addition, a supporting pillar 34 is provided at the center of the lower surface of each micromirror 36.

In this DMD 20, the bases of the supporting pillars 34 are attached to hinges 40 corresponding to each pixel. The hinges 40 are provided on a CMOS SRAM cell 38 having silicon gates which are produced on an ordinary semiconductor memory production line. The micromirrors 36 provided on the supporting pillars 34 can be inclined in the range of $\pm\alpha$ degrees ($\pm10$ degrees) in a diagonal line direction with the hinge 40 as the axis.

In this DMD 20, mirror address electrodes 42 are placed at both ends in the diagonal directions toward which the micromirrors 36 incline on the SRAM cell 38. When the micromirror 36 is in an on state, the micromirror 36 can be driven and controlled to incline $+\alpha$ degrees by utilizing electrostatic force generated by a charge accumulated in one of the mirror address electrodes 42. When the micromirror 36 is in an off state, the micromirror 36 can be inclined $-\alpha$ degrees by utilizing the electrostatic force in the other mirror address electrode 42.

In the DMD 20 having the above configuration, when a digital signal is written into the SRAM cell 38, the micromirror 36 in each pixel is controlled according to the image signal, and the micromirror 36 is inclined at $\pm\alpha$ degrees in the on state or $-\alpha$ degrees in the off state relative to the substrate side on which the DMD 20 is arranged, which reflects the light incident to the DMD 20 in each inclined direction of the micromirror 36.

The on state light reflected from the micromirror 36 is modulated in the exposure state, and this light is incident to an optical projection system (see FIG. 1) provided at the light emitting side of the DMD 20. The off state light reflected from the micromirror 36 is modulated in the non-exposure state, and this light is incident to a light absorber (not shown).

Next, the optical projection system (image-forming optical system) provided at the light reflecting side of the DMD 20 in the exposure head 14 will be described. As shown in FIG. 1, in order to focus a light source image onto the recording medium 12 located in an exposure plane at the light reflecting side of the DMD 20, the image-forming optical system (optical projection system) includes a first image-forming optical lens system 44 and 46, a micro-lens array 48 which is an intermediate image-forming unit, a pixel block shifting member 50 which is arranged behind the micro-lens array 48 on the optical path and near the micro-lens array 48, a second image-forming optical lens system 52 and 54, and an auto-focusing prism pair 56 in that order from the DMD 20 side toward the recording medium. It is also possible that apertures (not shown in FIG. 1) are arranged in front of and at the back of the micro-lens array 48 on the optical path.

The plural micro-lenses are integrally formed in the micro-lens array 48 that is an intermediate image-forming unit, and the micro-lenses correspond one-to-one to each micromirror 36 of the DMD 20, which reflects the laser beam emitted from the light source unit 24 through the optical fiber 28. Each micro-lens is arranged on the optical axis of each laser beam transmitted through the first image-forming optical lens system 44 and 46. In the exposure head 14, when a decrease in the diameter of a beam spot is not required on the exposure plane (for example, when it is appropriate to perform the exposure process with a large beam spot diameter, or when the configuration of the optical system is simplified to reduce troublesome adjustment work for attaching the micro-lens array), the micro-lens array 48 may be omitted and replaced by a pixel block shifting member 50 at the micro-lens array 48 placement position (focal point) shown in FIG. 1.

The pixel block shifting member 50 used in the exposure head 14 of the image forming apparatus is an optical member in which, when performing the exposure process using the DMD 20, the number of dots (the number of channels which is the number of beam spots) which can be simultaneously exposed in the direction orthogonal to the scanning direction is increased by effectively utilizing the pixels in the longitudinal direction of the DMD 20 and a stable halftone expression can be recorded with the FM screen.

The pixel block shifting member 50 is configured to have the following functions: the plural exposure beam spot positions, which are projected at the exposure plane (surface of recording medium 12) from a group of micromirrors 36 two-dimensionally arrayed in an m by n matrix in the DMD 20, are divided into plural blocks on the exposure plane with respect to the scanning direction (main scanning direction which is the feeding direction); the relative positions between the blocks are shifted by a predetermined amount in the direction (sub-scanning direction) orthogonal to the scanning direction (main scanning direction) and the gaps in the sub-scanning direction between the plural exposure beam spots exposed within one block are exposed by the plural beam spots of other blocks; and the number of dots which can simultaneously be exposed with respect to the direction orthogonal to the scanning direction in performing the exposure process using the DMD 20 is increased.

Thus, the number of dots (the number of channels, which is the number of beam spots) which can simultaneously be exposed can be increased by dividing the exposure beam spot positions, projected onto the exposure surface from the exposure head 14, into the plural blocks and shifting the exposure beam spot positions in the direction orthogonal to the scanning direction. At this time, the rate of increase in the number of dots (the number of channels which is the number of beam spots) which can simultaneously be exposed is proportional to the number of divided blocks, which are divided into blocks and shifted (for example, shifted with equal spacing) so that the exposure positions in the blocks do not overlap each other. Accordingly, the required rate of increase in the number of dots (the number of channels which is the number of beam spots) which can simultaneously be exposed can be set by appropriately adjusting and selecting the number of divided blocks and the amount of shift.

The pixel block shifting member 50 can be formed as an optical element utilizing light refraction, an optical element utilizing light diffraction, or an optical element utilizing light polarization.

Figure 2:
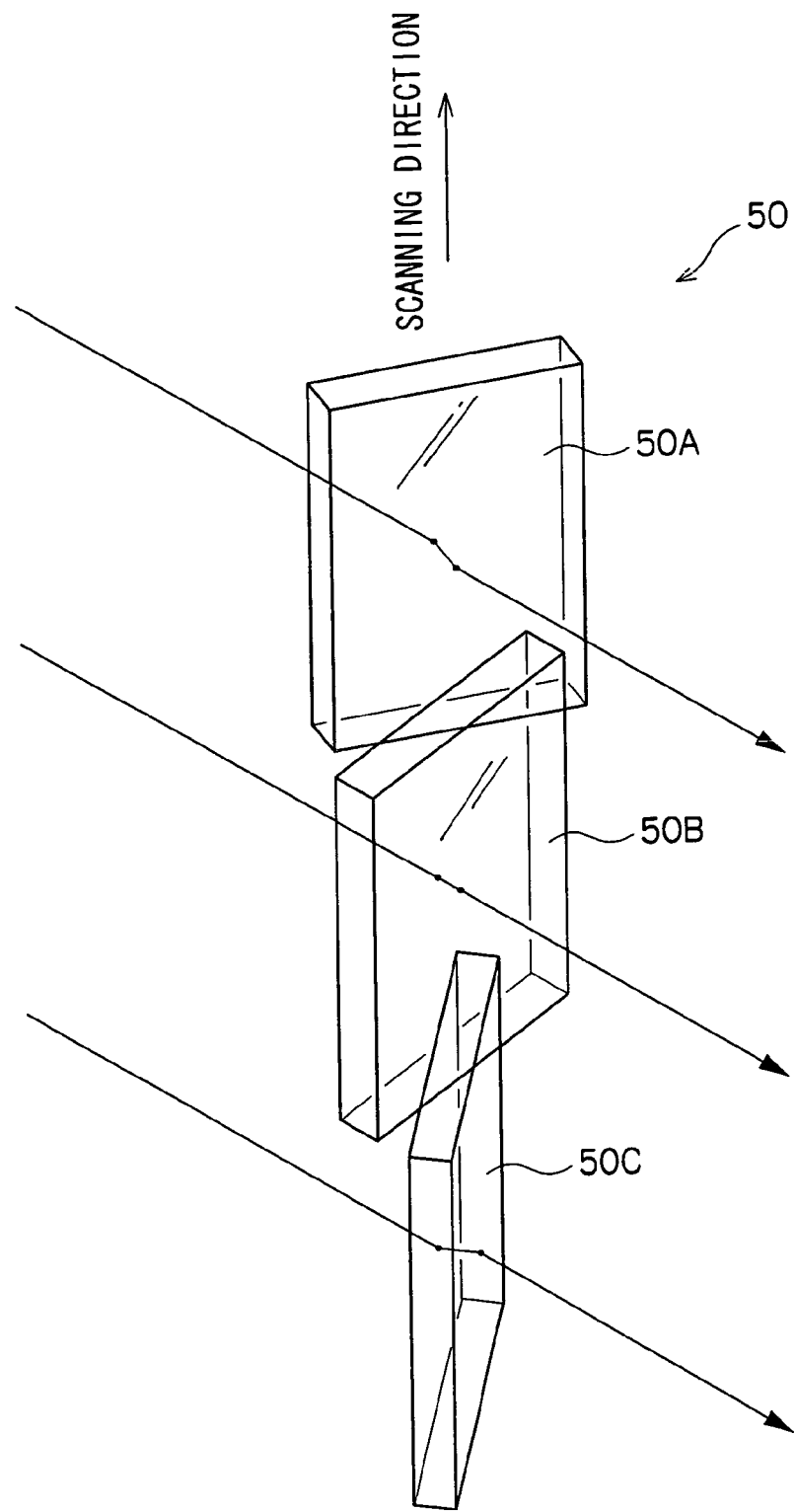
FIG. 2 is a perspective view showing a pixel block shifting member, which is used in the exposure head and utilizes light refraction.
Figure 3:
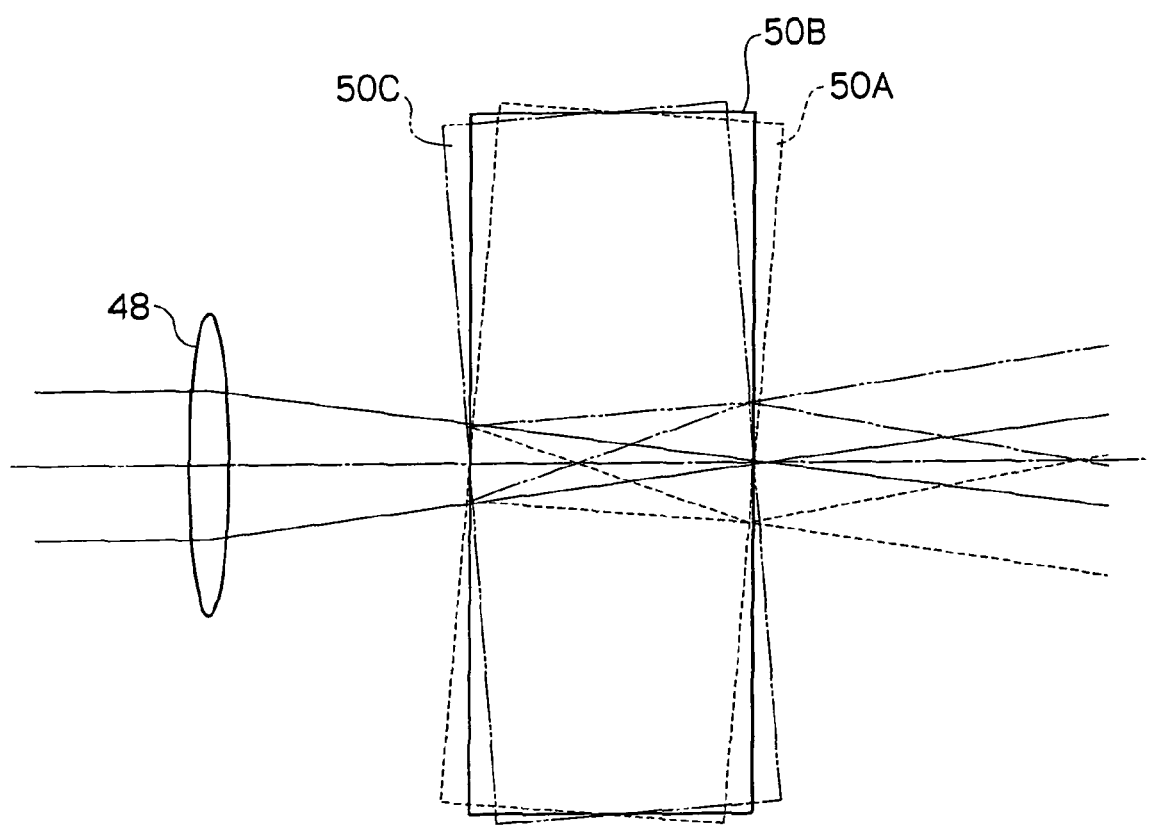
FIG. 3 is an explanatory view showing effects of a pixel block shifting member, which is used in the exposure head and utilizes light refraction.
Figure 7:
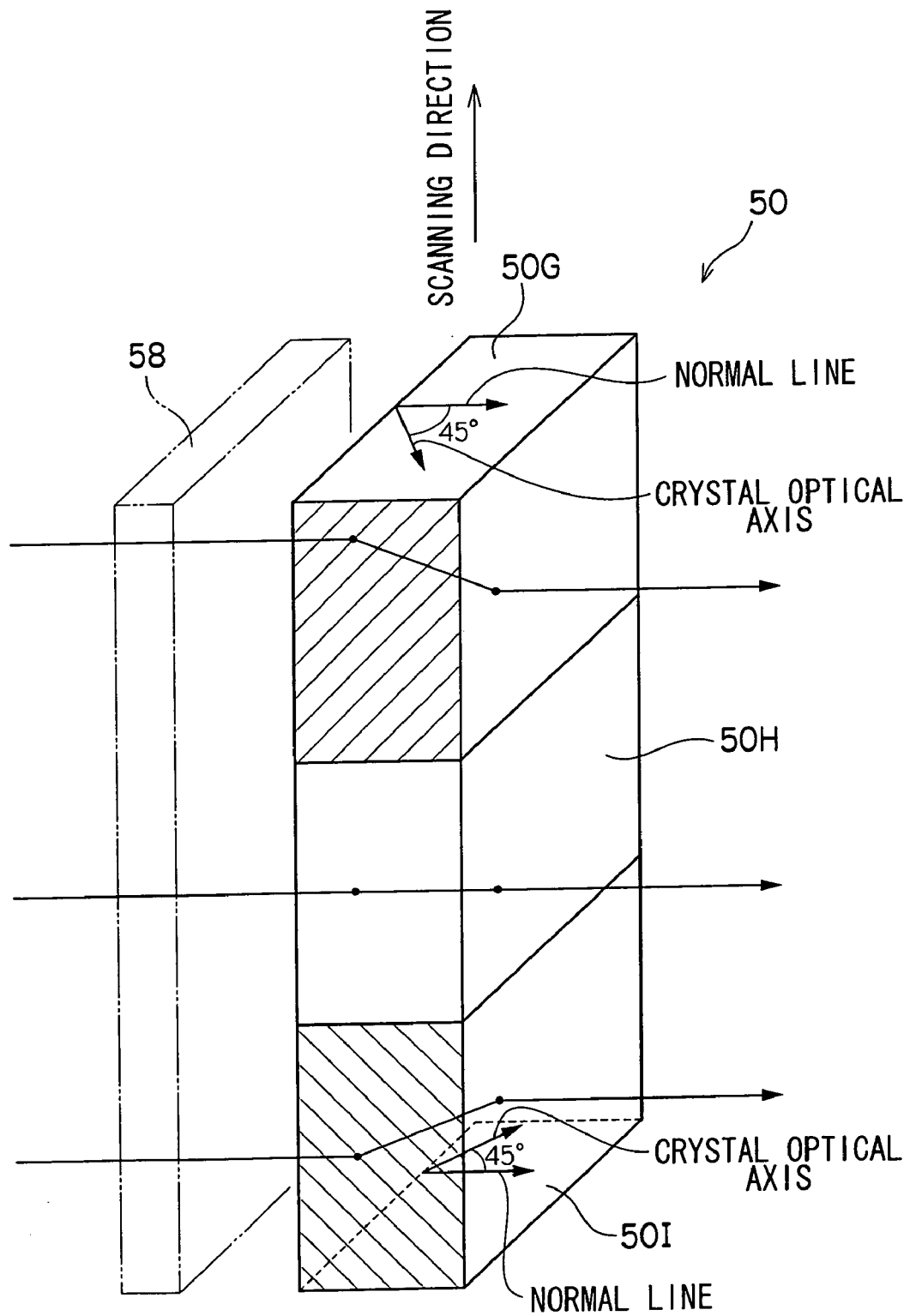
FIG. 7 is a perspective view showing a pixel block shifting member, which is used in the exposure head and utilizes light polarization.

In the case where the pixel block shifting member 50 is formed as an optical element utilizing light refraction, for example, the pixel block shifting member 50 is formed as shown in FIGS. 2, 3, and 7, and the pixel block shifting member 50 is formed by using plural transparent flat-plate optical members (optical materials such as pieces of optical glass formed in flat plates having the same thickness). Although three optical members are used in the pixel block shifting member 50 shown in FIGS. 2, 3, and 7, the optical members may be integrally formed into one optical member.

Namely, as shown in FIG. 2, the pixel block shifting member 50 includes a first optical member 50A, a second optical member 50B, and a third optical member 50C which utilize light refraction. The optical members 50A, 50B, and 50C are arranged in a series with no gap in the scanning direction (feeding direction) on the optical path, the second optical member 50B is arranged so as to be orthogonal to the optical axis, the first optical member 50A is arranged inclined at a predetermined angle in one direction relative to the optical axis, and the third optical member 50C is arranged inclined at a predetermined angle in the other direction relative to the optical axis.

In this pixel block shifting member 50, the first optical member 50A, the second optical member 50B, and the third optical member 50C which utilize light refraction are arranged at an upper stage, an intermediate stage, and a lower stage, respectively; and the upper-stage first optical member 50A and the lower-stage third optical member 50C are arranged rotated by a predetermined angle relative to the axis of the scanning direction (see FIG. 3).

The upper-stage first optical member 50A is arranged rotated by a first angle in a predetermined direction relative to the axis of the scanning direction. At the same time, the lower-stage third optical member 50C may be arranged rotated by a second angle in the same predetermined direction as the first optical member 50A relative to the axis of the scanning direction.

In the second optical member 50B a length (distance between the first optical member 50A and the third optical member 50C) in the scanning direction (feeding direction) is set at a length in which the optical path width is divided equally into three sections. The optical path width corresponds to the length in the scanning direction (feeding direction) of the optical path from the whole group of micromirrors 36 of the DMD 20 at the placement position of the pixel block shifting member 50 to the exposure surface (surface of recording medium 12). Further, the second optical member 50B is arranged so that the midpoint on the length thereof in the scanning direction corresponds to the midpoint of the optical path width in the scanning direction of the optical path from the whole group of micromirrors 36 of the DMD 20 at the placement position of the pixel block shifting member 50 to the exposure surface.

Figure 8:
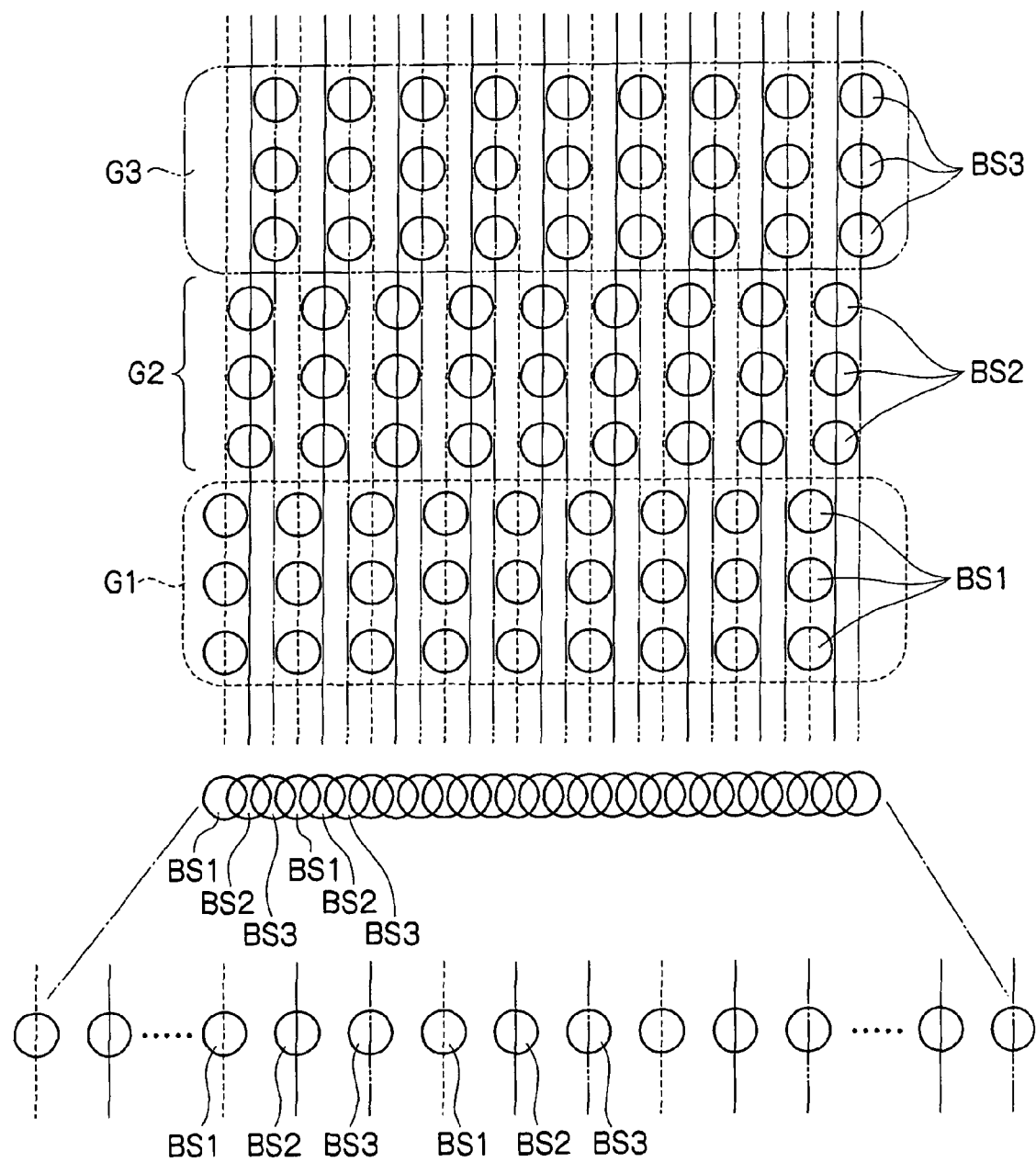
FIG. 8 is an explanatory view showing beam spots projected onto an exposure surface when performing exposure with the exposure head.

According to the above configuration, the pixel block shifting member 50 can equally divide the group of micromirrors 36 two-dimensionally arranged in the DMD 20 into three sections in the scanning direction on the exposure surface (divide the group of micromirrors 36 into three sections so that the number of beam spots becomes equal in the scanning direction), and the three equally divided three blocks G1, G2, and G3 can be set as shown in FIG. 8.

In the pixel block shifting member 50 which is formed as an optical element utilizing light refraction, as shown in FIG. 3, the multi-beams of the laser beam are refracted by appropriately adjusting the angle in which the first optical member 50A is inclined in one direction relative to the optical axis. Therefore, a group of beam spots BS1 in the first block G1 is shifted in one direction by one-third of the distance between the adjacent beam spots in the direction orthogonal to the scanning direction with respect to another group of beam spots BS2 in the second block G2 (for example, shifted to the left side by one-third pitch).

Further, in the pixel block shifting member 50, as shown in FIG. 3, the multi-beams of the laser beam are refracted by appropriately adjusting the angle in which the third optical member 50C is inclined in the other direction relative to the optical axis. Therefore, the group of beam spots BS3 in the third block G3 is shifted in the other direction by one-third of the distance between the adjacent beam spots in the direction orthogonal to the scanning direction with respect to the group of beam spots BS2 in the second block G2 (for example, shifted to the right side by one-third pitch).

When the pixel block shifting member 50 is arranged in the above-described manner in the exposure head 14 of the image forming apparatus, in the direction orthogonal to the scanning direction, each beam spot BS1 in the first block G1 and each beam spot BS3 in the third block G3 are arranged at even intervals between the adjacent beam spots BS2 in the second block G2. In this state, the exposure process can be performed.

Therefore, in the case of this exposure head 14, as a result of the scanning exposure onto the exposure surface, the number of dots (the number of channels, which is the number of beam spots) which can simultaneously be exposed with respect to the position on a straight line located in the direction orthogonal to the scanning direction can be increased threefold as shown in FIG. 8. Namely, the pitch between the adjacent beam spots becomes one-third and the addressability (positional resolution) can be improved threefold.

Also, in the exposure head 14 in which the three blocks G1, G2, and G3 shifted relative to one another are set in the pixel block shifting member 50, the second image-forming optical system 52 and 54 is formed, for example, as a magnifying optical system to magnify a cross section of light beam rays reflected from the DMD 20, which enlarges the size of the exposure area 16 (FIG. 11) on the recording medium 12 exposed by the light beam rays reflected from the DMD 20 threefold when compared with the area of a light reflecting plane which is formed by arraying a number of the micromirrors 36 in a lattice shape in the DMD 20.

When the second image-forming optical lens system 52 and 54 is formed as the magnifying optical system, for example, it is also possible that the micro-lens array or other optical members are utilized to reduce the beam spot such that the image of the beam spot is formed on the exposure surface of the recording medium 12 and has a predetermined beam-spot diameter.

In the exposure head 14, the image of the light beam projected from the second image-forming optical lens system 52 and 54 is formed on the recording medium 12 placed in the exposure plane while setting the focal point using the auto-focusing function of a prism pair 56. In the optical projection system, the lenses of the first image-forming optical lens system 44 and 46 and the second image-forming optical lens system 52 and 54 are shown in FIG. 1 as single lenses. However, the lenses of the first image-forming optical lens system 44 and 46 and the second image-forming optical lens system 52 and 54 may be formed by combinations of plural lenses (for example, a convex lens and a concave lens).

Figure 9:
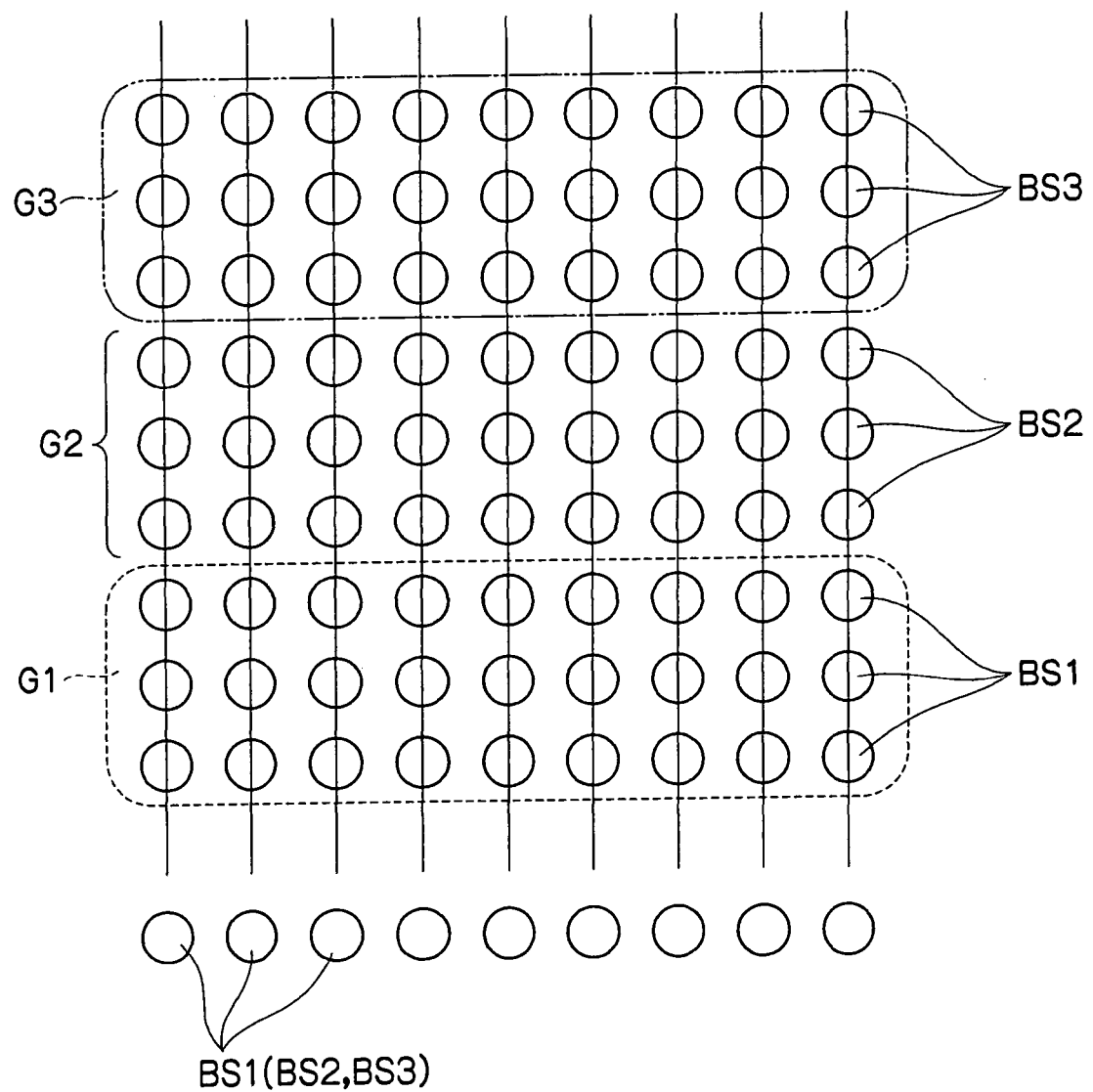
FIG. 9 is an explanatory view showing a comparative example of the beam spots projected onto the exposure surface in order to explain the effects of the exposure with the exposure head.

In the case where the exposure head 14 is formed as described above, the area over which the one-time scanning exposure can be performed in the direction orthogonal to the scanning direction on the exposure surface of the recording medium 12 can be tripled when compared with a comparative example shown in FIG. 9 if the feeding speed in the scanning direction is the same. In the comparative example, the scanning exposure is performed only with the predetermined number of micromirrors 36 arranged in the direction orthogonal to the scanning direction of the DMD 20 (when the exposure process is not performed while the DMD 20 is inclined toward the scanning direction).

Therefore, in the case where the same number of exposure heads 14 is utilized to perform the exposure process onto the entire exposure surface of the recording medium 12 while the recording medium 12 is moved back and forth plural times in the scanning direction, the scanning process speed (speed from the start to the end of the exposure process onto one recording medium 12 using the same number of exposure heads 14) can be improved and the efficiency of the exposure process can be improved.

In the exposure head 14, the mutually shifted plural blocks (three blocks in this case) G1, G2, and G3 are set by the pixel block shifting member 50. In this exposure head 14, the second image-forming optical lens system 52 and 54 may be formed as an optical system having a magnification lower by the number of shifted blocks (magnification lower than three times in this case). Of course, the so-called addressability (positional resolution) may be improved by reducing the pitch between the beam spots adjacent to each other in the direction orthogonal to the scanning direction when compared with the comparative example shown in FIG. 9 (in which a scanning exposure is performed only with a predetermined number of micromirrors 36 arranged in the direction orthogonal to the scanning direction of the DMD 20).

Further, in the exposure head 14 in which the mutually shifted plural blocks (three blocks in this case) G1, G2, and G3 are set by the pixel block shifting member 50, sometimes the exposure process cannot be performed when the pixels are not clearly distinguished from each other at the boundaries between the blocks G1, G2, and G3 on the exposure surface of the recording medium 12, and crosstalk is generated between the pixels at the boundaries of the three blocks G1, G2, and G3. In this case, in order to decrease the crosstalk, a countermeasure can be taken of not using the pixels corresponding to the boundaries of the three blocks G1, G2, and G3 in the DMD 20.

The pixel block shifting member 50 may be formed to shift and divide the pixel block shifting member 50 into two blocks of the third optical member 50C and the combination of the second optical member 50B and the first optical member 50A, or into two blocks of the first optical member 50A and the combination of the second optical member 50B and the third optical member 50C. The pixel block shifting member 50 may also be formed to shift and divide the pixel block shifting member 50 into two blocks of the second optical member 50B and the combination of the first optical member 50A and the third optical member 50C.

Figure 4:
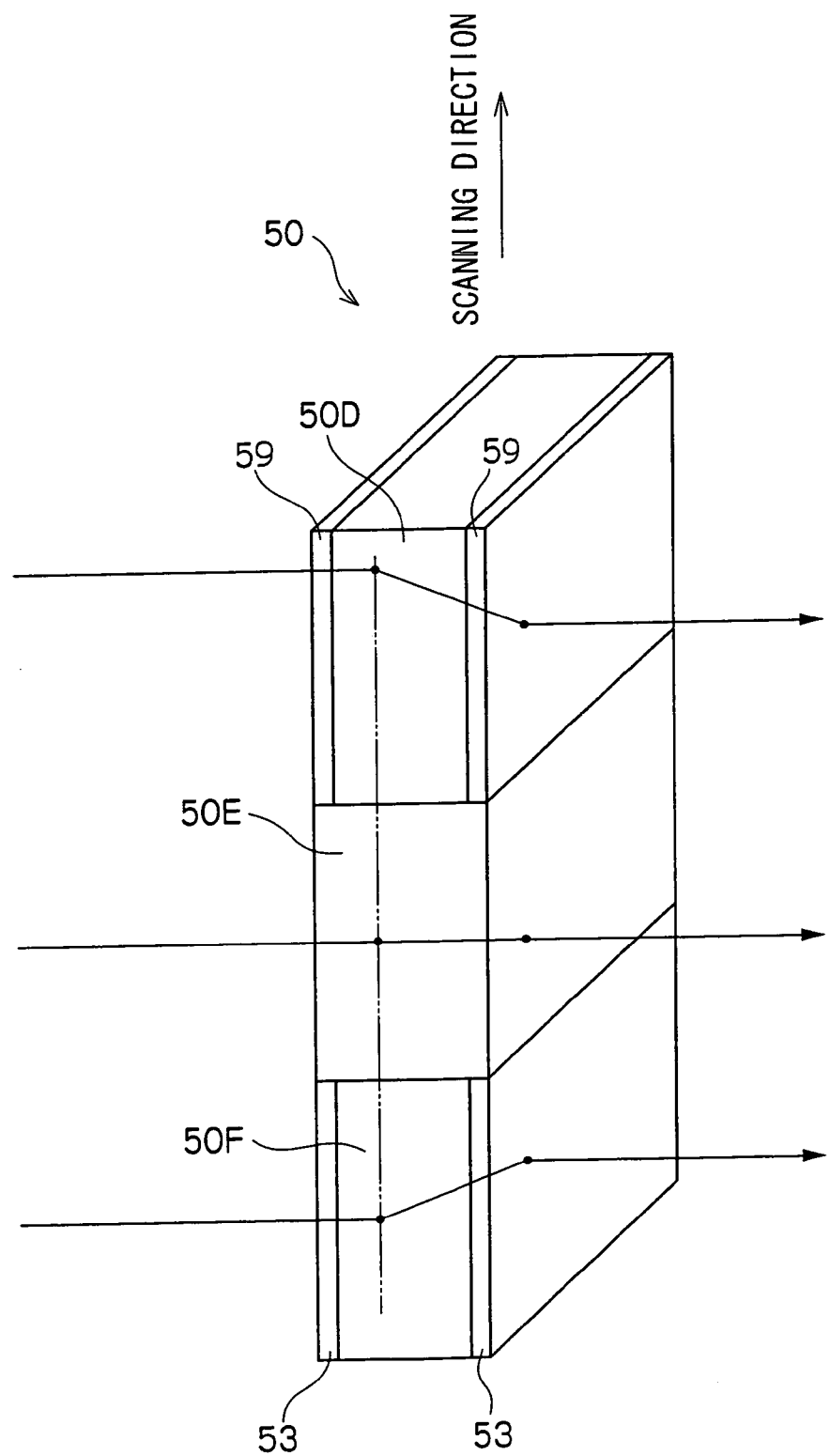
FIG. 4 is a perspective view showing a pixel block shifting member, which is used in the exposure head and utilizes light diffraction.
Figure 5:
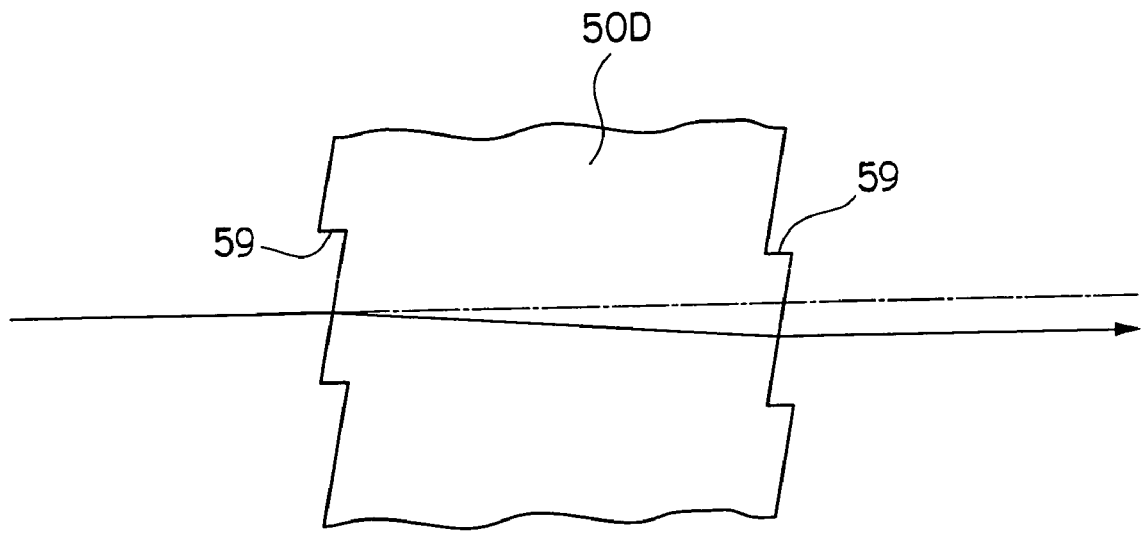
FIG. 5 is an explanatory view showing the effects of a first refraction unit in the pixel block shifting member, which is used in the exposure head and utilizes light diffraction.
Figure 6:
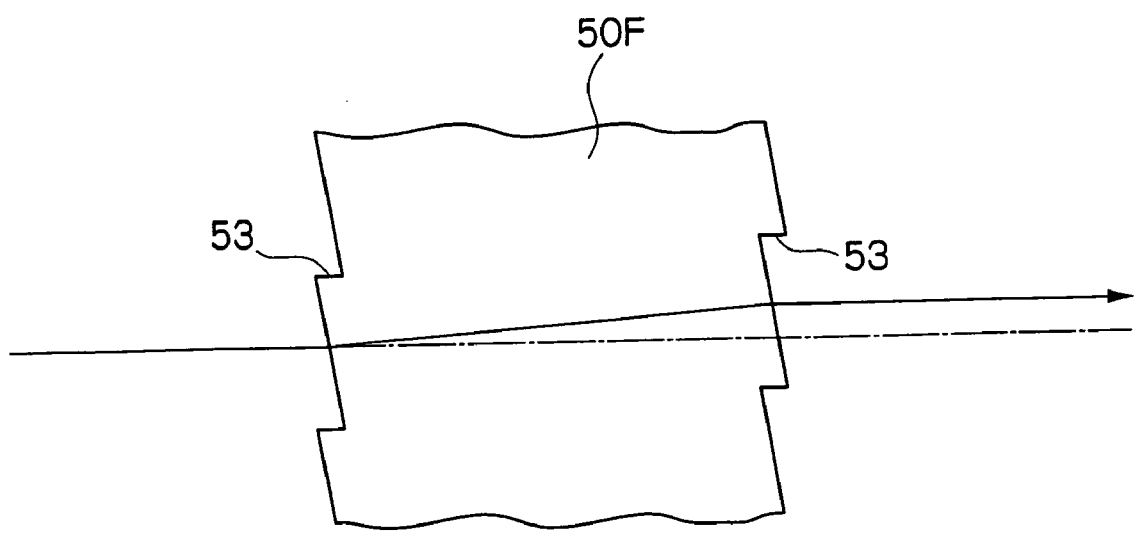
FIG. 6 is an explanatory view showing the effects of a third diffraction unit in the pixel block shifting member, which is used in the exposure head and utilizes light diffraction.

Also, the pixel block shifting member 50 may be formed as an optical element utilizing light diffraction. Examples of an optical element utilizing light diffraction include a hologram and an element in which a binary optical element (diffraction member) is welded on. Referring to FIGS. 4 to 6, an example of the configuration in which the binary optical element is used will be described below.

In the pixel block shifting member 50 which is configured as the optical element utilizing light diffraction shown in FIG. 4, one flat plate is made of optical glass and the like and formed in a transparent flat member having uniform thickness, and the flat plate is divided into three areas (sections) of an upper stage, an intermediate stage, and a lower stage in the direction of the scanning direction (main scanning direction). The upper stage is a first diffraction unit 50D, the intermediate stage is a second transmission unit 50E, and the lower stage is a third diffraction unit 50F.

The second transmission unit 50E is configured so as to transmit the light beam along a linear optical path, and the length in the scanning direction thereof (feeding direction), i.e. the distance between the first diffraction unit 50D and the third diffraction unit 50F is set at one-third of the optical path width in the scanning direction (feeding direction) of the optical path corresponding to the whole group of micromirrors 36 of the DMD 20 at the placement position of the pixel block shifting member 50 to the exposure plane (surface of recording medium 12).

Further, the second transmission unit 50E is arranged so that the midpoint of the length thereof in the scanning direction corresponds to the midpoint of the optical path width in the scanning direction of the optical path from the whole group of micromirrors 36 of the DMD 20 at the placement position of the pixel block shifting member 50 to the exposure surface.

According to the above configuration, the pixel block shifting member 50 can divide the group of micromirrors 36 two-dimensionally arranged in the DMD 20 into three equal sections in the scanning direction on the exposure surface (that is, divide the group of micromirrors 36 into three sections so that the number of beam spots becomes three equal parts in the scanning direction), and the three equally divided blocks G1, G2, and G3 can be set as shown in FIG. 8.

In the pixel block shifting member 50 which is formed as an optical element utilizing light diffraction, as shown in FIG. 5, the surface and backside of the first diffraction unit 50D is formed as a first binary optical element (BOE) 59. The first BOE 59 has a function of diffracting the light beam to shift the beam spot by a predetermined amount toward one side in the direction orthogonal to the scanning direction.

As shown in FIG. 6, the surface and backside of the third diffraction unit 50F is formed as a second binary optical element (BOE) 53. The second BOE 53 has a function of diffracting the light beam to shift the beam spot by a predetermined amount toward the other side in the direction orthogonal to the scanning direction.

The first BOE 59 and the second BOE 53 are formed from generally used binary optical elements (diffraction members). For example, as shown in FIGS. 5 and 6, in a planar optical glass forming the entire pixel block shifting member 50, the first BOE 59 and the second BOE 53 can be formed by providing minutely inclined planes as seen in cross sections of the front and back surfaces of the first diffraction unit 50D and the third diffraction unit 50F. Actually, the minutely graduated slopes are formed as indented portions by repeatedly performing etching.

The first BOE 59 and the second BOE 53 are formed as inclined planes of a minute approximately triangular cross-sectional structure on the front and back surfaces of the first diffraction unit 50D and the third diffraction unit 50F, respectively. Each minute approximately triangular cross-sectional structure extends linearly from one side to the other side in the direction orthogonal to the scanning direction. In the first BOE 59 and the second BOE 53, the height of the minute approximately triangular cross-sectional structure (that is, the height of the steps) is formed so as to become integer multiples of the following equation, wherein a refractive index of the diffraction member is set at n, the refractive index of air is set at 1, the wavelength of light is set at $\lambda$, and the number of steps is set at N.

$$\frac{\lambda}{n-1} \cdot \frac{N-1}{N}$$

In the first BOE 59 and the second BOE 53, when the number of steps (levels) is eight levels in the minutely stepped portion formed in the slope in each recessed portion, the percentage of the light diffracted in a predetermined direction by the first BOE 59 and the second BOE 53 becomes about 95% in theory. In the case of an inclined plane having 16 levels, the percentage becomes about 98.7%. In the case of an inclined plane having 32 levels, the percentage becomes about 99.5%.

Accordingly, the first BOE 59 and the second BOE 53 can actually be used in practice as long as the first BOE 59 and the second BOE 53 are formed to about 16 levels or 32 levels depending on the acceptable limit of stray light on the exposure surface.

As can be seen by comparing FIGS. 5 and 6, the first diffraction unit 50D in which the first BOE 59 is provided and the third diffraction unit 50F in which the second BOE 53 is provided are formed such that the slopes of the binary optical elements are opposite to each other. Namely, the direction in which the light beam is diffracted to shift the position of the beam spot by the first BOE 59 is configured to be opposite to the direction in which the light beam is diffracted to shift the position of the beam spot by the second BOE 53.

Further, when the thicknesses of the first diffraction unit 50D in which the first BOE 59 is provided and the third diffraction unit 50F in which the second BOE 53 is provided are changed and adjusted, the amount of shift of the beam-spot position with which the exposure surface of the recording medium 12 is irradiated can be set at a predetermined amount.

In the case where the pixel block shifting member 50 provided in the exposure head 14 of the multi-beam exposure apparatus is formed as an optical element utilizing light diffraction, the same actions and effects can be obtained as with the case in which the pixel block shifting member 50 is formed as the optical element utilizing light refraction.

The pixel block shifting member 50 may be formed to shift and divide the pixel block shifting member 50 into two blocks of the third diffraction unit 50F and the combination of the second transmission unit 50E and the first diffraction unit 50D, or into two blocks of the first diffraction unit 50D and the combination of the second transmission unit 50E and the third diffraction unit 50F. The pixel block shifting member 50 may also be formed to shift and divide the pixel block shifting member 50 into two blocks of the second transparent unit 50E, and the combination of the first diffraction unit 50D and the third diffraction unit 50F.

Next, referring to FIG. 7, an example of the configuration in which the pixel block shifting member 50 is formed as an optical element utilizing light polarization will be described.

The pixel block shifting member 50, formed as the optical element utilizing light polarization shown in FIG. 7, is formed in a transparent flat plate having the same thickness. The flat plate is divided into three areas (sections) of an upper stage, an intermediate stage, and a lower stage in the scanning direction (main scanning direction). The upper stage is set at a first polarization unit 50G, the intermediate stage is set at a second transparent unit 50H, and the lower stage is set at a third polarization unit 50I.

The second transparent unit 50H is formed so as to transmit light beams through a linear optical path, and the length in the scanning direction (feeding direction), i.e. the distance between the first polarization unit 50G and the third polarization unit 50I is set at one-third of the optical path width corresponding to the distance in the scanning direction (feeding direction) of the optical paths from the whole group of micromirrors 36 of the DMD 20 at the placement position of the pixel block shifting member 50 to the exposure plane (surface of recording medium 12).

Further, the second transparent unit 50H is arranged so that the midpoint of the length in the scanning direction corresponds to the midpoint of the optical path width in the scanning direction at the placement position of the pixel block shifting member 50 of the optical paths from the whole group of micromirrors 36 of the DMD 20 to the exposure plane.

According to the above configuration, the pixel block shifting member 50 can divide the group of micromirrors 36 two-dimensionally arranged in the DMD 20 into three equal sections in the scanning direction on the exposure plane (divide the group of micromirrors 36 into three sections so that the number of beam spots becomes equal in the scanning direction), and the three equally divided blocks G1, G2, and G3 can be set as shown in FIG. 8.

In the following description, it is considered that light having a polarized direction parallel to the direction of shift is incident to the pixel block shifting member 50.

In the pixel block shifting member 50 which is formed as the optical element utilizing light polarization, the first polarization unit 50G is formed by a generally used beam displacer. This beam displacer has the function of shifting the outgoing direction of an extraordinary ray to one side in the direction orthogonal to the scanning direction. The extraordinary ray is generated by transmitting a light beam through the beam displacer. The beam displacer of the first embodiment is configured such that a crystal optical axis is inclined by 45° in the beam shifting direction with respect to a normal line to the incident plane.

Further, the third polarization unit 50I is formed by an additional generally used beam displacer. This beam displacer has the function of shifting the outgoing direction of the extraordinary ray to the other side in the direction orthogonal to the scanning direction. The extraordinary ray is generated by transmitting the light beam through the beam displacer.

In other words, the direction in which the first polarization unit 50G polarizes light beams to shift the beam-spot positions projected onto the exposure surface is configured to be opposite to the direction in which the third polarization unit 50I polarizes light beams to shift the positions of beam spots projected onto the exposure surface.

Further, when the thicknesses of the first polarization unit 50G and the third polarization unit 50I are changed and adjusted, the amount of shift in the position of the beam spot projected onto the exposure surface of the recording medium 12 can be set to a predetermined amount.

Various methods can be considered as a method for setting the polarized direction of the light in parallel with the shift direction. For example, a polarizing plate 58 may be placed in front of the pixel block shifting member 50.

In the case where the pixel block shifting member 50 provided in the exposure head 14 of the multi-beam exposure apparatus is formed as the optical element utilizing light polarization, the same actions and effects can be obtained as with the case in which the pixel block shifting member 50 is formed as the optical element utilizing light refraction.

The pixel block shifting member 50 may be formed to do shifting by dividing the pixel block shifting member 50 into two blocks of the third polarization unit 50I and the combination of the second transparent unit 50H and the first polarization unit 50G, or into two blocks of the first polarization unit 50G and the combination of the second transparent unit 50H and the third polarization unit 50I. The pixel block shifting member 50 may also be formed to do shifting by dividing the pixel block shifting member 50 into two blocks of the second transparent unit 50H and the combination of the first polarization unit 50G and the third polarization unit 50I.

Next, a group of micromirrors 36 is arranged in the exposure head 14 such that the directions of the lattice array shape of the group of micromirrors 36 corresponds to the scanning direction and to the direction orthogonal to the scanning direction. The aforementioned pixel block shifting member 50 is provided to divide the two-dimensionally arranged group of micromirrors 36 of the DMD 20 into three equal sections in the scanning direction on the exposure surface, and three evenly divided blocks G1, G2, and G3 are set as shown in FIG. 8. In this state, the actions and effects when performing the exposure process onto the recording medium 12 will be described below.

As shown in FIG. 8, when the positions of the first exposure points arranged in the direction orthogonal to the scanning direction are exposed by the exposure head 14, the multiple exposures are performed by the groups of three beam spots BS1 belonging to the block G1. When the positions of the second exposure points (adjacent positions on the right side) adjacent to the positions of the first exposure points are exposed by the exposure head 14, the multiple exposures are performed by the groups of three beam spots BS2 belonging to the block G2. When the positions of the third exposure points (adjacent position on the right side) adjacent to the positions of the second exposure points are exposed by the exposure head 14, the multiple exposures are performed by the groups of three beam spots BS3 belonging to the block G3.

Thus, the predetermined plural exposure points continuously arranged in the direction orthogonal to the scanning direction are each selected to perform the multiple exposures, and the recording medium 12 is moved in the scanning direction to perform the exposure process onto the entire exposure area of the recording medium 12.

When the exposure process is performed onto the recording medium 12 by the exposure head 14, including the pixel block shifting member 50 while the lattice-shaped array of the group of micromirrors 36 is arranged so as to align with the scanning direction, one dot is formed on the recording medium 12 by performing the exposure plural times at staggered time intervals in the pixels arranged along the main scanning line.

At this point, since the positions of the beam spots in which the multiple exposures are performed in order to record one dot in the recording medium 12 accurately align with one another, the exposure amount distribution in a single recorded dot does not spread in the sub-scanning direction, and the edge of the recorded dot shape can be kept sharp.

Accordingly, in the exposure head 14, the FM screen can be recorded with dots whose edges are sharpened. Further, the change in density which is generated by the rapid change in the dot-image ratio (dot-coverage ratio characteristic) due to a change in the circumferential length of the recording pixel can be prevented, and a stable halftone expression can be recorded using the FM screen. The change in the circumferential length of the recording pixel is caused by the recording conditions such as light power fluctuation and the number of prints, or the development conditions such as the degree of development of the automatic developing machine.

Next, the operation of the exposure head of the multi-beam exposure apparatus having the above configuration will be described.

In this multi-beam exposure apparatus, the image data is inputted to a control unit 22 connected to the DMD 20 according to the exposure pattern, and the image data is temporarily stored in a memory in the control unit 22. This image data is one in which the density of each pixel constituting the image is expressed in terms of a binary value (presence or absence of dot recording).

After the exposure head 14 performs one scan from the upstream side to the downstream side in the scanning direction (the moving stage is stopped during the scan), the recording medium 12 is moved while attached onto the surface of the moving stage (not shown).

When the recording medium 12 on the moving stage passes under the exposure head 14, the plural lines of the image data stored in the memory are sequentially read, and a control signal (control data) is generated based on the read image data by the control device which is a data processing unit. The control signal is compatible with the process of forming the arrangement, in which the two-dimensional arrangement of the exposure beam spots is divided into the plural blocks and shifted by a predetermined distance between the blocks in the direction orthogonal to the scanning direction.

Each of the micromirrors of DMD 20 placed in the exposure head 14 is on/off-controlled based on the generated control signal. When the control unit 22 is irradiated with the laser beam from the light source unit 24, the laser beam is reflected in the on state of the micromirror of DMD 20, and the exposure is performed by forming the image of the laser beam at the required position of the exposure beam spot, in which the addressability is improved in the feeding direction.

The recording medium 12 is two-dimensionally exposed with the exposure head 14 by repeating the movement of the recording medium 12 along with the moving stage after the exposure head 14 performs one scan onto the recording medium 12.

In the multi-beam exposure apparatus according to the first embodiment, a DMD is used as the spatial light modulation element used in the exposure head 14. For example, a MEMS (Micro Electro Mechanical System) type of spatial light modulation element (SLM; Spatial Light Modulator), an optical element (PLZT element) which modulates the transmission light by electro-optic effect, and other spatial light modulation elements such a ferro-electric liquid crystal light shutter (FLC) and the like, except for the MEMS type of spatial light modulation element, can be used instead of the DMD.

In addition to the spatial light modulation element in which only the on and off states are taken, it is also possible to use a spatial light modulation element in which plural intermediate values can be taken in addition to the on and off states to express the gray scale.

Micro-systems in which micro-size sensors, actuators, and control circuits are integrated by micromachining technology based on an IC manufacturing process should be collectively called "MEMS", and the MEMS-type of spatial light modulation element means a spatial light modulation element which is driven by electro-mechanical action utilizing electrostatic force.

In the multi-beam exposure apparatus according to the first embodiment, the DMD 20 which is the spatial light modulation element used in the exposure head 14 may be formed by replacing the DMD 20 with means for selectively turning on and off the plural pixels which are one-dimensionally or two-dimensionally arranged.

For example, the means for selectively turning on and off the plural pixels can include a laser beam source which can emit the laser beam by selectively turning on and off the laser beam corresponding to each pixel, or a laser beam source in which a planar laser element is formed by arranging microlaser emission surfaces according to the pixels and the light emission can be realized by selectively turning on and off each micro-laser emission surface.

The multi-beam exposure apparatus of the present invention is not limited to the first embodiment, and the multi-beam exposure apparatus of the invention may also be configured as a presensitized plate exposure setter. Various modifications can also be made without deviating from the scope of the invention.

Next, a second embodiment of the present invention will be described below. In the following description, only configurations different from the first embodiment will be described, and the description of the same configurations as the first embodiment will be omitted.

The second embodiment differs from the first embodiment in the optical projection system of the exposure head 14. Therefore, the optical projection system (image-forming optical system) provided on the light reflecting side of a DMD 20 in the exposure head 14 of the second embodiment will be described below.

Figure 12:
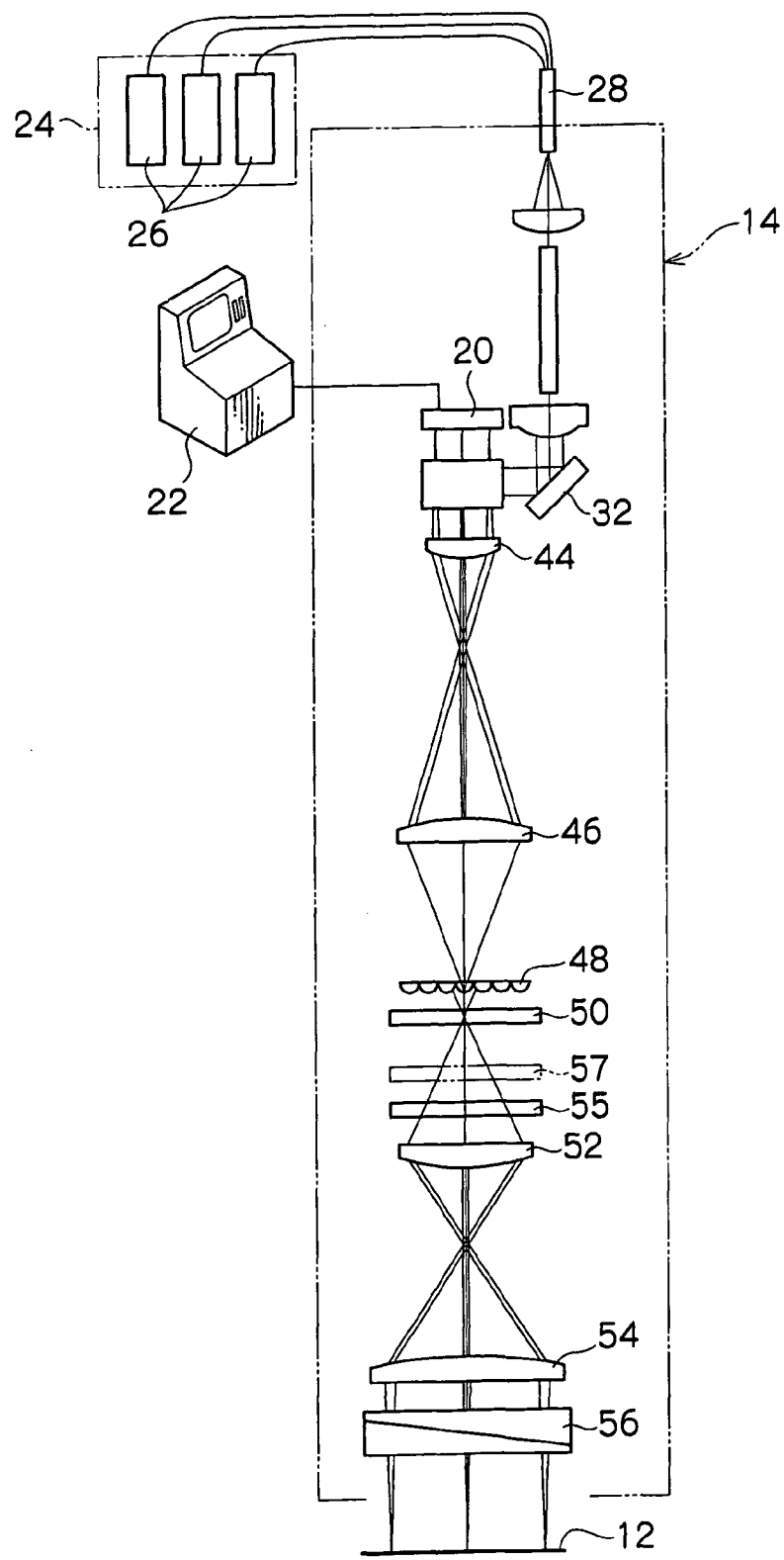
FIG. 12 is a schematic view showing the exposure head unit of a multi-beam exposure apparatus of a second embodiment according to the multi-beam exposure apparatus of the present invention.

As shown in FIG. 12, in the optical projection system (image-forming optical system) provided on the light reflection side of the DMD 20 in the exposure head 14, because the light source image is formed on the recording medium 12 located in the exposure plane on the light reflection side of the DMD 20, the optical projection system includes optical members for use in exposure. Namely, the optical projection system includes the first image-forming optical lens system 44 and 46, the micro-lens array 48, the pixel block shifting member 50, a uniaxial crystal optical element 55, the second image-forming optical lens system 52 and 54, and the auto-focusing prism pair 56 in that order from the DMD 20 side toward the recording medium 12. The micro-lens array 48 is the intermediate image-forming unit. The pixel block shifting member 50 is arranged on the optical path at the back of the micro-lens array 48 and near the micro-lens array 48. The uniaxial crystal optical element 55 is arranged on the optical path at the back of the pixel block shifting member 50 and near the pixel block shifting member 50.

In the optical projection system, the lenses of the first image-forming optical lens system 44 and 46 and the second image-forming optical lens system 52 and 54 are shown as single lenses, respectively. However, the lenses of the first image-forming optical lens system 44 and 46 and the second image-forming optical lens system 52 and 54 may be formed by combinations of plural lenses (for example, a convex lens and a concave lens).

The first image-forming optical lens system 44 and 46, the second image-forming optical lens system 52 and 54, and other lens systems (not shown) are configured to have a conjugate correlation with one another in the optical projection system of the exposure head 14.

In the optical projection system of the exposure head 14, each micromirror 36 of the DMD 20 is arranged at a front focal position of the lens system 44. The first image-forming optical lens system 44 and 46 is arranged in a confocal position where respective rear focal position and front focal position are shared. The micro-lens array 48 is arranged at the rear focal position of the lens system 46.

The plural micro-lenses are integrally formed in the micro-lens array 48 which is an intermediate image-forming unit, and the micro-lens corresponds one-to-one to each micromirror 36 of the DMD 20 which reflects the laser beam emitted from the light source unit 24 through the optical fiber 28. Each of the micro-lenses is arranged on the optical axis of each laser beam transmitted through the first image-forming optical lens system 44 and 46.

The micro-lenses provided in the micro-lens array 48 has positive lens power, and the micro-lens has the function of reducing the beam diameter of the laser beam. Each micromirror 36 and the micro-lens array 48 have a conjugate correlation with each other.

In the optical projection system of the exposure head 14, as shown in FIG. 12 for example, the pixel block shifting member 50 (for increasing the number of channels) is arranged at the rear focal position (which is the front focal position of the second image-forming optical lens system 52) of the micro-lenses 36 in the micro-lens array 48 located at the rear focal position of the lens system 46. The uniaxial crystal optical element 55 (for dividing the beam) is arranged on the optical path between the pixel block shifting member 50 and the second image-forming optical lens system 52 and 54.

In the exposure head 14 of the multi-beam exposure apparatus, the beam spot projected onto the exposure surface is formed into a rectangular shape, which enables a favorable formation of the FM screen. Therefore, so-called beam division is performed to scan the recording surface of the recording medium 12.

Accordingly, the uniaxial crystal optical element 55 is arranged on the optical path of the image-forming optical system between the pixel block shifting member 50 and the second image-forming optical lens system 52 and 54 in the exposure head 14. In the exposure head 14, the optical element such as a Rochon prism or a Wollaston prism which are methods of dividing the beam into angles, or an optical element such as a beam displaying prism which is a method of dividing the beam in parallel, may be used as the uniaxial crystal optical element 55.

In this case, the beam displacer whose crystal optical axis is inclined by 45 degrees with respect to both the incident plane and the normal is used as the uniaxial crystal optical element 55.

Figure 14:
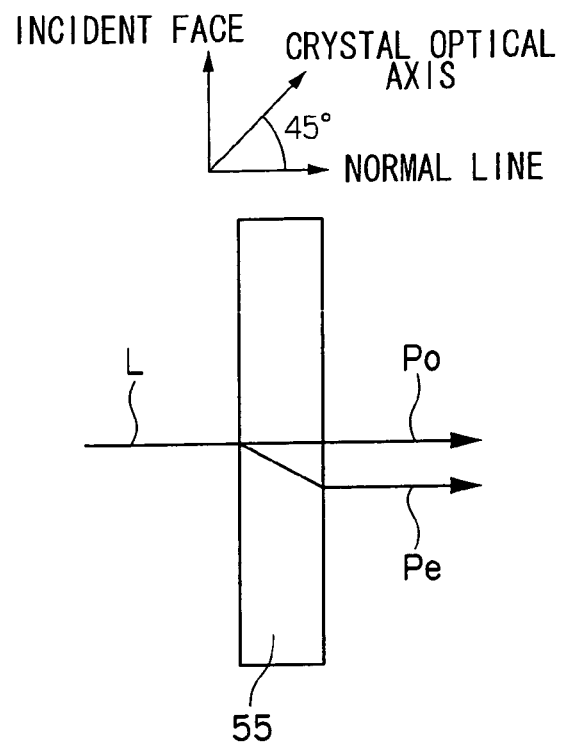
FIG. 14 is an explanatory view showing the effect of a uniaxial crystal optical element used in the exposure head according to the second embodiment.

When the circularly polarized light beam (randomly polarized light beam may be used) is incident to this uniaxial crystal optical element 55, as shown in FIG. 14, the light beam is separated into an ordinary ray Po and an extraordinary ray Pe having quantities of the ordinary ray Po and the extraordinary ray Pe equal to each other. In this case, the ordinary ray Po and the extraordinary ray Pe are shifted in parallel with each other. For example, when the shift amount (division width) is set at 5.5 µm at a wavelength of 405 nm in the uniaxial crystal optical element 55, quartz may be used as the uniaxial crystal optical element 55 and the thickness of the crystal set at about 0.904 mm.

The quartz used as the material for this uniaxial crystal optical element 55 has the advantages that the material is stable, quartz is low cost, and quartz can also be applied at a diameter of 30 mm. A refraction angle of the extraordinary ray Pe can be arbitrarily adjusted by the thickness in the optical axis direction and the material of the uniaxial crystal optical element 55.

Figure 15:
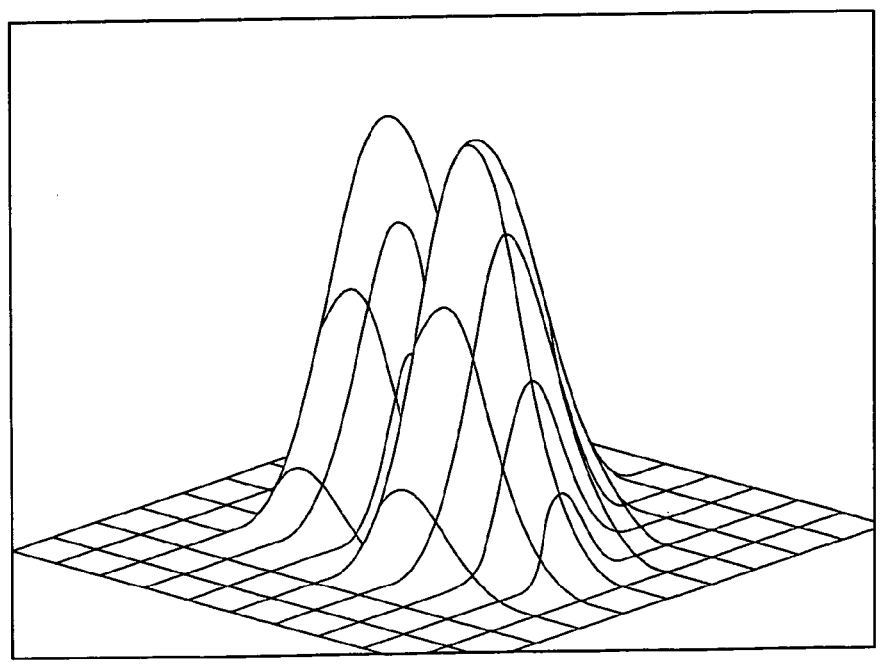
FIG. 15 is an explanatory view showing a light quantity distribution of a beam spot divided by the exposure head according to the second embodiment.

When the beam spot shape in which the two light beams overlap each other is formed by separating the light beam into the ordinary ray Po and the extraordinary ray Pe having quantities equal to each other to shift the light beams in parallel (an angle division method may be used), i.e. when the beam spot is formed by the beam division, as shown in FIG. 15, two Gaussian beams having half-value widths of 5 µm overlap each other while the two beams are shifted by 5.5 µm (divided beam state is obtained). Namely, the beam spot shape becomes an approximately rectangular shape in the sub-scanning direction, and the beam spot shape also becomes sharp in the main scanning direction (the edge portion of the beam spot becomes sharp).

Figure 16:
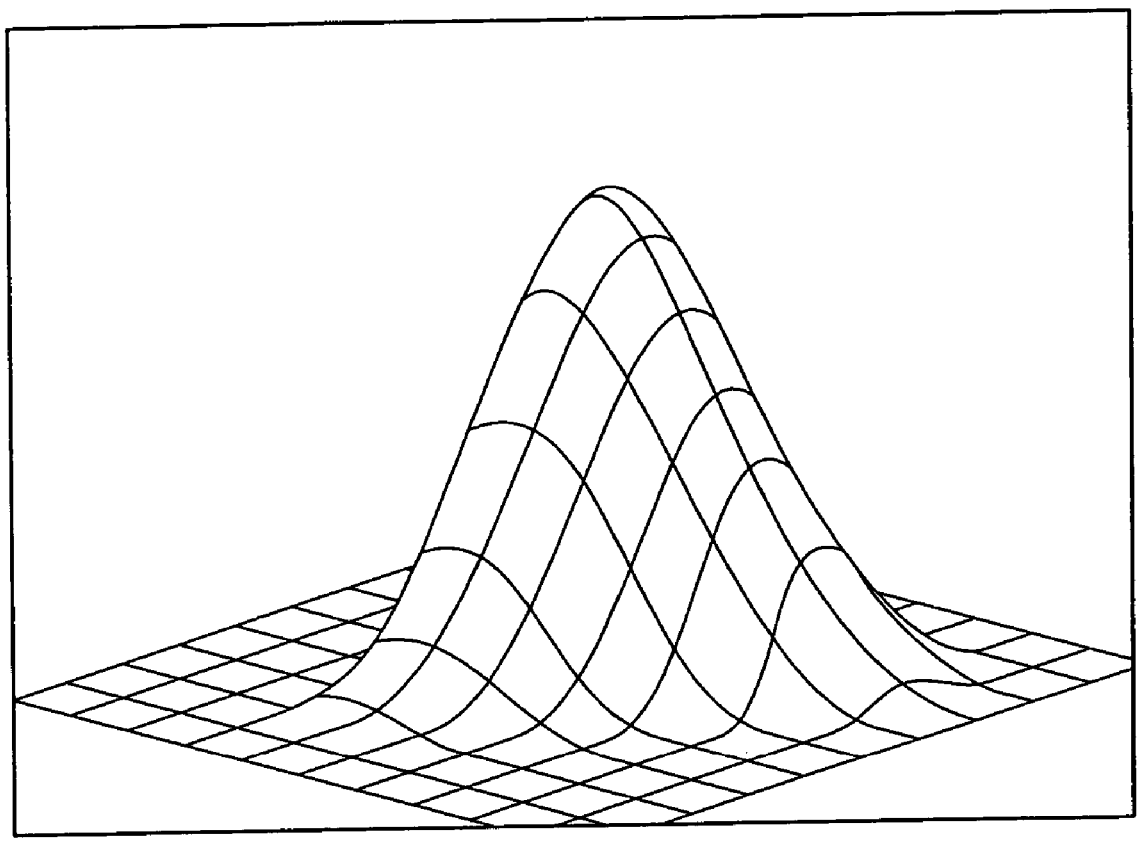
FIG. 16 is an explanatory view showing a light quantity distribution of a conventional beam spot having a Gaussian distribution which is usually used, for comparison with the light quantity distribution of the beam spot divided by the exposure head according to the second embodiment.

When the beam spot shape of FIG. 15 is compared with the comparative example of FIG. 16 in which the conventional beam spot shape has a Gaussian distribution whose half-value width is 8.8 µm ($1/e^2$ width is 15 µm), the conventional beam spot shape having the Gaussian distribution has a circular cross-section and the beam spot shape does not extend in the sub-scanning direction, and the beam spot shape is not sharp in the main scanning direction because the beam spot shape becomes broadened toward the end (that is, the edge portion of the beam spot is not sharp). Accordingly, it is clear that the multi-beam exposure apparatus of the second embodiment has an advantage when compared with the conventional technology.

In the exposure head 14 of the multi-beam exposure apparatus of the second embodiment, the uniaxial crystal optical element 55 is arranged such that the plane including the crystal optical axis and the normal (normal line to the incidence plane) (see FIG. 14) in the uniaxial crystal optical element 55 corresponds to the direction orthogonal to the scanning direction on the exposure surface, which results in the state in which the two beam spots overlap each other in the direction (sub-scanning direction) orthogonal to the scanning direction, i.e. the state in which the two beam spots are arranged in the sub-scanning direction while partially overlapping each other.

In this exposure head 14, since the exposure beam spot shape is narrowed down in the scanning direction to obtain the rectangular spot shape, the edge portion of the exposure amount distribution which forms one dot on the recording medium 12 can be sharpened in the direction (sub-scanning direction) orthogonal to the scanning direction, and the edge of the exposure amount distribution can also be sharpened after the scan is performed in the scanning direction.

In this exposure head 14, in order to perform the beam division during the exposure process, means for utilizing refraction or means for utilizing diffraction may be used in addition to the uniaxial crystal optical element 55. Further, in this exposure head 14, the uniaxial crystal optical element 55 may be placed at the recording medium 12 side of the second image-forming optical lens system 52 and 54.

In this exposure head 14, when the pixel block shifting member 50 shown in FIG. 7 (see the first embodiment) is formed by an optical element utilizing light polarization, the polarized direction of the light beam passing through the pixel block shifting member 50 becomes only a linearly polarized beam which generates an extraordinary ray. Therefore, as shown by an imaginary line in FIG. 12, a quarter-wave plate 57, which is a polarization adjusting means, is arranged on the optical path in front of the uniaxial crystal optical element 55 (at the back of the pixel block shifting member 50), the laser beam is transmitted through the pixel block shifting member 50 in which the light polarization is utilized, and the laser beam including the linear polarization is configured to be converted into circularly polarized light by transmitting the laser beam through the quarter-wave plate 57.

In the exposure head 14, a half-wave plate may be used instead of the quarter-wave plate 57. Namely, a structure is acceptable in which an ordinary ray Po and an extraordinary ray Pe are alternately emitted at the same light quantity from the uniaxial crystal optical element 55, by causing the laser beam to be incident on the uniaxial crystal optical element 55 after the polarized direction is adjusted by the half-wave plate.

In this exposure head 14, means for performing random polarization can be provided as the polarization adjusting means on the optical path at the back of the pixel block shifting member 50, and the randomly polarized light beams may be incident to the uniaxial crystal optical element 55.

Next, the actions and effects in the case where an exposure process is performed onto the recording medium 12 by the exposure head 14 having the above configuration will be described below.

Figure 13:
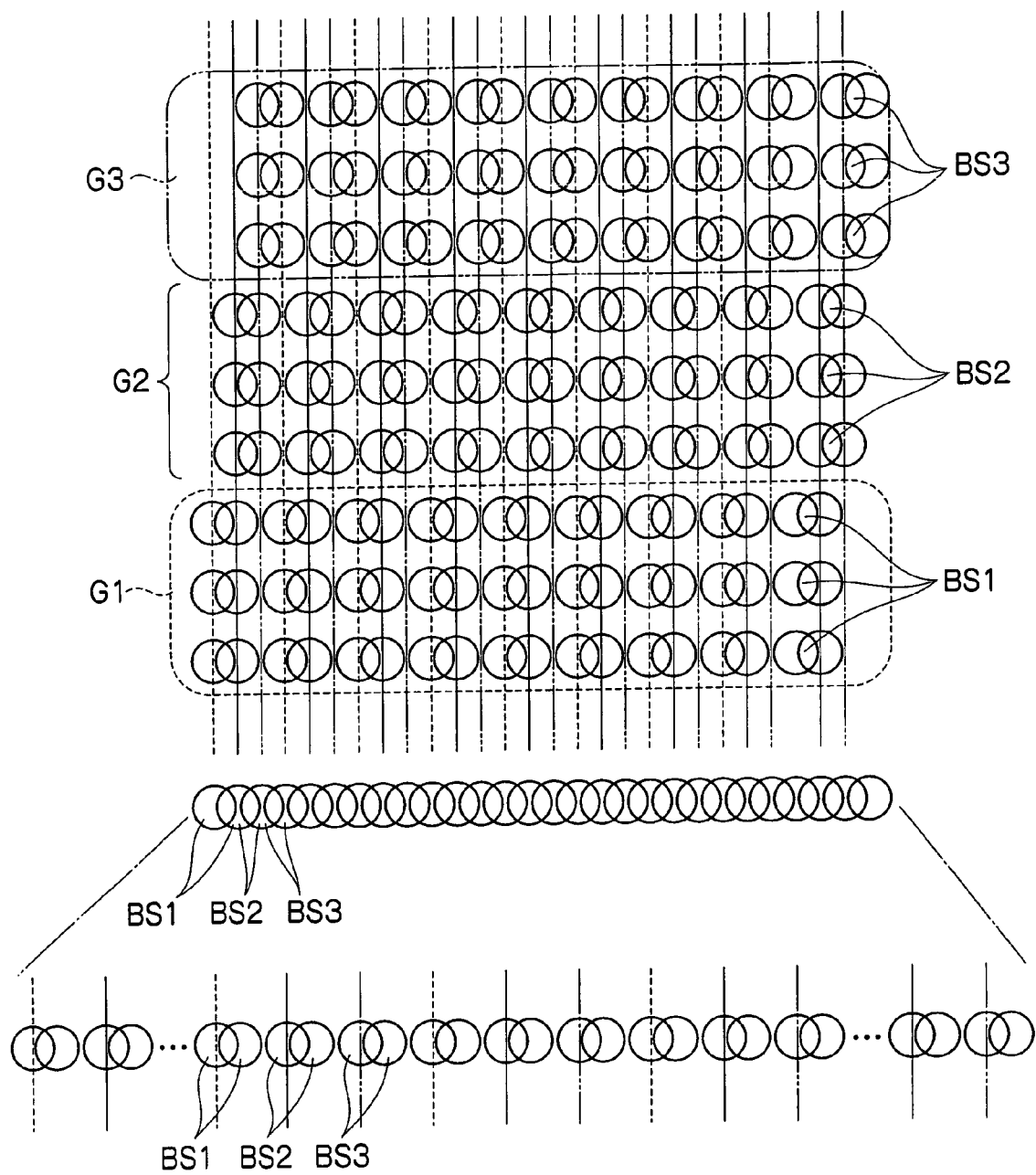
FIG. 13 is a schematic view showing an exposure state having an approximately rectangular distribution in which exposure beam spots are made to overlap each other using the exposure head according to the second embodiment.

In the exposure head 14, the group of micromirrors 36 (FIG. 10) is arranged such that the directions of the lattice-shaped array correspond to the scanning direction and the direction orthogonal to the scanning direction. The pixel block shifting member 50 divides the two-dimensionally arranged group of micromirrors 36 of DMD 20 into three equal sections in the scanning direction on the exposure surface, and the three evenly divided blocks G1, G2, and G3 are set as shown in FIG. 13. In this configuration, each beam spot is formed in the rectangular shape by the uniaxial crystal optical element 55 to perform the exposure process on the recording medium 12.

Therefore, when the positions of the first exposure points arranged in the direction orthogonal to the scanning direction are exposed by the exposure head 14, the multiple exposures are performed by the groups of three beam spot pairs BS1 belonging to the block G1. When the positions of the second exposure points (adjacent positions on the right side in FIG. 13) adjacent to the positions of the first exposure points are exposed by the exposure head 14, the multiple exposures are performed by the groups of three beam spot pairs BS2 belonging to the block G2. When the positions of the third exposure points (adjacent positions on the right side in FIG. 13) adjacent to the positions of the second exposure points are exposed by the exposure head 14, the multiple exposures are performed by the groups of three beam spot pairs BS3 belonging to the block G3.

Thus, while the predetermined plural exposure points continuously arranged in the direction orthogonal to the scanning direction are selected to perform the multiple exposures, the recording medium 12 is moved in the scanning direction to perform the exposure process onto the whole of the exposure area in the recording medium 12.

When the exposure process is performed onto the recording medium 12 by the exposure head 14 including the pixel block shifting member 50 while the lattice-shaped array of the group of micromirrors 36 corresponds to the scanning direction, one dot is formed on the recording medium 12 by performing the exposure plural times at staggered time intervals with the pixels arranged along the main scanning line.

At this point, since the positions of the beam spots in which the multiple exposures are performed in order to record one dot in the recording medium 12 accurately align with one another, the exposure amount distribution in the recorded one dot does not spread in the sub-scanning direction, and the edge of the recorded dot shape can be kept sharp.

In addition, according to the exposure head 14 of the second embodiment, each light beam is separated into two beams with light quantities equal to each other, the divided two light beams are shifted in parallel by the action of the uniaxial crystal optical element 55, and the two beam spots overlap each other on the exposure surface in the direction (sub-scanning direction) orthogonal to the scanning direction. Therefore, as shown in FIG. 15, the beam spots on the recording surface of the recording medium 12 have an approximately rectangular distribution in the sub-scanning direction at the focal point on the recording medium 12.

Namely, by means of this exposure head 14, while the beam spot is divided to form an approximately rectangular distribution, and the edge portion of the beam spot becomes sharp. The exposure process is performed while the longitudinal direction of the approximately rectangular distribution of the beam spot corresponds to the main scanning direction (direction orthogonal to the sub-scanning direction).

For the image in which the FM screen is recorded, the circumferential length of the recording pixel can be set so as not to fluctuate due to the recording conditions such as light power fluctuation and the number of prints, or the development conditions such as the degree of development of the automatic developing machine. Therefore, a rapid change in the dot-image ratio (dot-coverage ratio characteristic) can be prevented so as to hardly generate a fluctuation in density. As a result, the recording can be performed with a stable halftone expression when the FM screen is used.

Next, the operation of the multi-beam exposure apparatus having the above configuration will be described.

In this multi-beam exposure apparatus, the image data is inputted to the control unit 22 connected to the DMD 20 according to the exposure pattern, and the image data is temporarily stored in the memory in the control unit 22. The image data is one in which the density of each pixel constituting the image is expressed in terms of a binary value (presence or absence of dot recording).

After the exposure head 14 performs one scan from the upstream side to the downstream side in the scanning direction (the moving stage is stopped during the scan), the recording medium 12 is moved while attached onto the surface of the moving stage (not shown).

When the recording medium 12 on the moving stage passes under the exposure head 14, the plural lines of the image data stored in the memory are sequentially read, and a control signal (control data) is generated based on the read image data by the control device which is the data processing unit. This control signal is compatible with the process of forming the arrangement in which the two-dimensional arrangement of exposure beam spots is divided into plural blocks and shifted by a predetermined distance between the blocks in the direction orthogonal to the scanning direction.

Each of the micromirrors of DMD 20 placed in the exposure head 14 is on/off controlled based on the generated control signal. When the control unit 22 is irradiated with the laser beam from the light source unit 24, the laser beam is reflected in the on state of the micromirror of DMD 20, and the exposure is performed by forming the image of the laser beam into the rectangular shape at the corresponding required position of the exposure beam spot.

As shown in FIG. 11, the recording medium 12 is two-dimensionally exposed with the exposure head 14 by repeating the movement of the recording medium 12 along with the moving stage after the exposure head 14 performs one scan onto the recording medium 12.

In the multi-beam exposure apparatus according to the second embodiment, the DMD 20, which is a two-dimensional light modulator used in the exposure bead 14, may be replaced with means for selectively turning on and off the plural pixels. Namely, in the second embodiment, the two-dimensional light modulator may include means for selectively turning on and off the plural pixels.

For example, the means for selectively turning on and off the plural pixels can include a laser beam source which can emit the laser beam by selectively turning on and off the laser beam corresponding to each pixel, or a laser beam source in which the planar laser element is formed by arranging micro-laser emission surfaces according to each pixel and the light emission can be realized by selectively turning on and off each micro-laser emission surface.

The multi-beam exposure apparatus of the present invention is not limited to the above embodiments, and the multi-beam exposure apparatus of the present invention may be formed as the presensitized plate exposure setter. Various modifications can also be made without deviating from the scope of the invention.

Next, a third embodiment of the present invention will be described below. In the following description, only configurations different from the first embodiment will be described, and the description of the same configurations as the first embodiment will be omitted.

The third embodiment differs from the first embodiment in the optical projection system of the exposure head 14. Therefore, the optical projection system (image-forming optical system) provided on the light reflection side of a DMD 20 in the exposure head 14 of the third embodiment will be described below.

Figure 17:
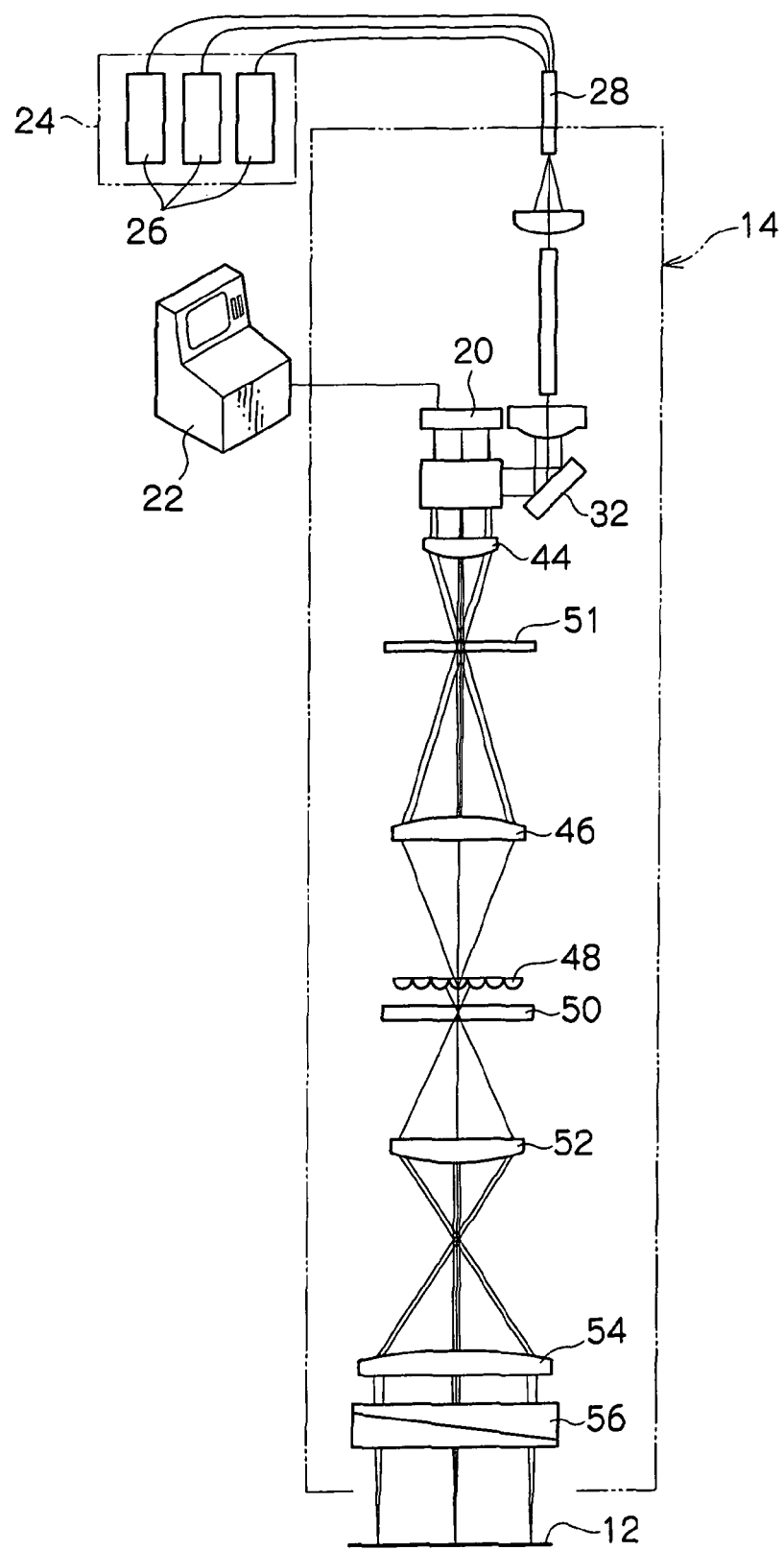
FIG. 17 is a schematic view showing the exposure head unit of a multi-beam exposure apparatus of a third embodiment according to the multi-beam exposure apparatus of the present invention.

As shown in FIG. 17, in the optical projection system (image-forming optical system) provided on the light reflection side of the DMD 20 in the exposure head 14, because the light source image is formed on the recording medium 12 located in exposure plane on the light reflection side of the DMD 20, the optical projection system has exposure optical members. Namely, the optical projection system includes the first image-forming optical lens system 44 and 46, the micro-lens array 48, the pixel block shifting member 50, a uniaxial crystal optical element 55, the second image-forming optical lens system 52 and 54, and the auto-focusing prism pair 56 in that order from the DMD 20 side toward the recording medium 12. The micro-lens array 48 is the intermediate image-forming unit. The pixel block shifting member 50 is arranged on the optical path at the back of the micro-lens array 48 and near the micro-lens array 48.

In the optical projection system, the lenses of the first image-forming optical lens system 44 and 46 and the second image-forming optical lens system 52 and 54 are shown as single lenses. However, the lenses of the first image-forming optical lens system 44 and 46 and the second image-forming optical lens system 52 and 54 may be formed by combinations of plural lenses (for example, a convex lens and a concave lens).

The first image-forming optical lens system 44 and 46, the second image-forming optical lens system 52 and 54, and other lens systems (not shown) are configured to have a conjugate correlation with one another in the optical projection system of the exposure head 14.

In the optical projection system of the exposure head 14, each micromirror 36 of the DMD 20 is arranged at the front focal position of the lens system 44. The first image-forming optical lens system 44 and 46 is arranged in the confocal position where respective rear focal position and front focal position are shared. The micro-lens array 48 is arranged at the rear focal position of the lens system 46.

The plural micro-lenses are integrally formed in the micro-lens array 48, which is the intermediate image-forming unit, and the micro-lenses correspond one-to-one to each micromirror 36 of the DMD 20 which reflects the laser beam emitted from the light source unit 24 through the optical fiber 28.

Each of the micro-lenses is arranged on the optical axis of each laser beam transmitted through the first image-forming optical lens system 44 and 46. The micro-lenses provided in the micro-lens array 48 has positive lens power, and the micro-lenses have the function of reducing the beam diameter of the laser beam. Each micromirror 36 and the micro-lens in the micro-lens array 48 have a conjugate correlation with each other.

Figure 18:
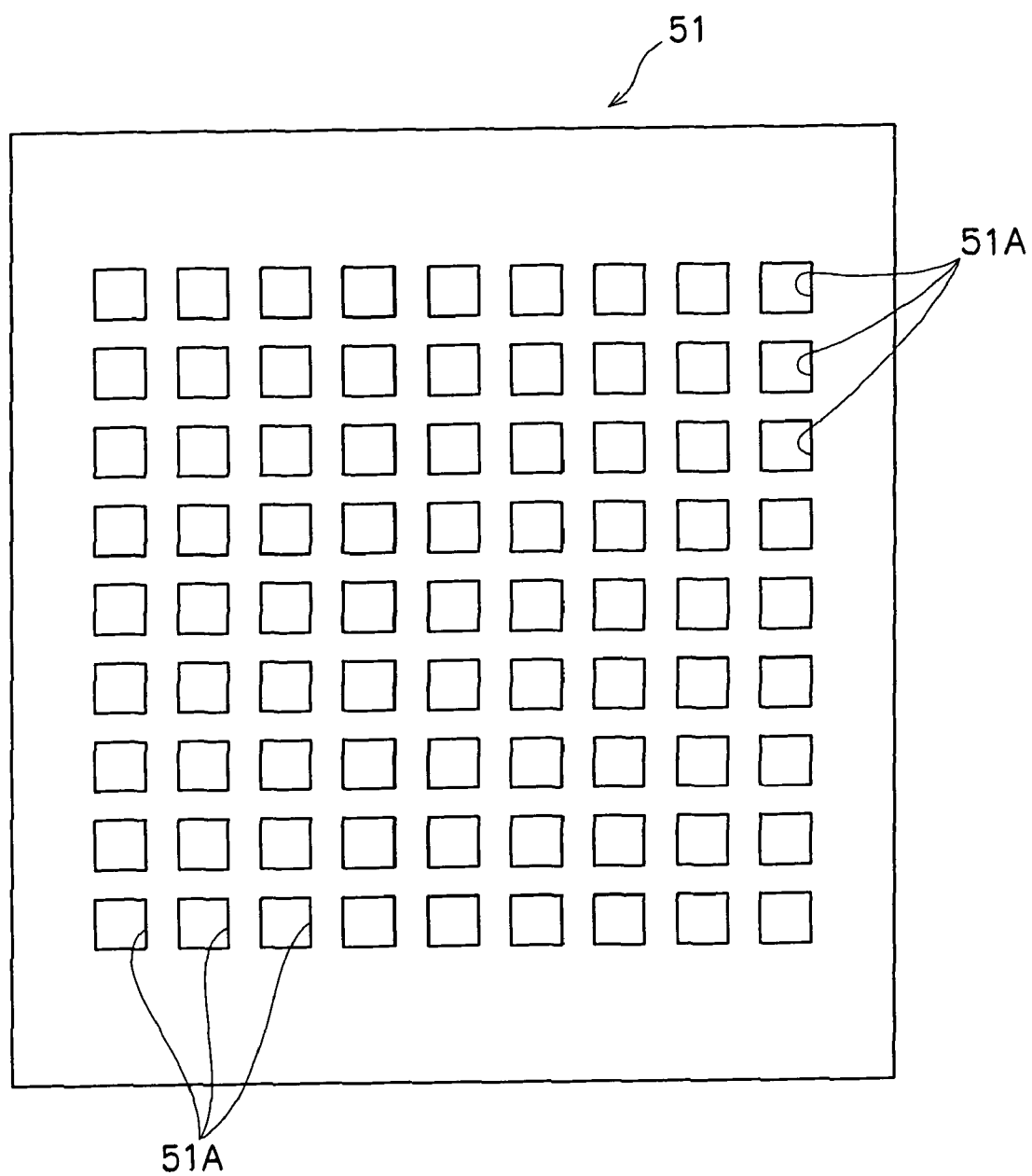
FIG. 18 is a front elevation showing an aperture array used in the exposure head according to the third embodiment.

An aperture 59 is arranged at the focal position in any one of the lens systems in the optical projection system of the exposure head 14. In the optical configuration of FIG. 21, plural apertures 59A are pierced in the aperture 59 corresponding one-to-one to each micromirror 36 of the DMD 20 as shown in FIG. 18. Each of the plural apertures 59A is formed as a through-hole pierced in a rectangular opening shape having a predetermined width. In the optical configuration shown in FIG. 17, one hole is pierced in the aperture 59. The aperture is formed as the through-hole pieced in a rectangular opening shape having a predetermined width.

In the beam spots which are formed on the exposure surface of the recording medium 12 by the optical projection system, the edge portion of the exposure amount distribution forming one dot may be sharpened in the sub-scanning direction by forming the aperture 59A in the opening shape which restricts at least the light spreading in the direction (sub-scanning direction) orthogonal to the scanning direction.

In the optical projection system of the exposure head 14, as shown in FIG. 17, the aperture 59 is arranged at the confocal position between the lens system 44 and the lens system 46 in the first image-forming optical system, and the pixel block shifting member 50 is arranged at the rear focal position (front focal position of the second image-forming optical lens system 52) of the micro-lenses in the micro-lens array 36 located at the rear focal position of the lens system 46.

Figure 20:
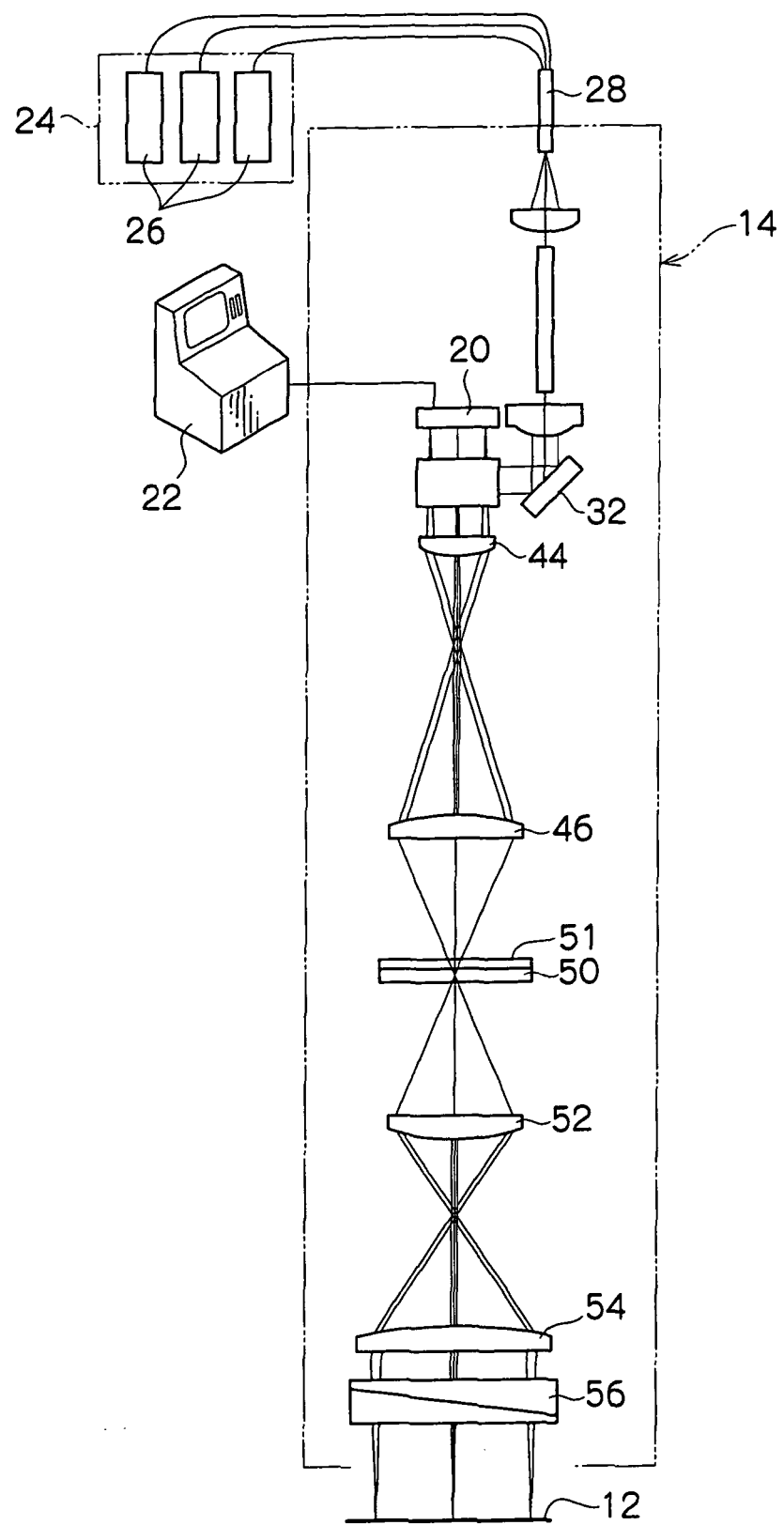
FIG. 20 is a schematic view showing an example of the exposure head unit, in which the pixel block shifting member and the aperture array are arranged adjacent to each other, in the multi-beam exposure apparatus according to the third embodiment.

In the optical projection system of the exposure head 14, as shown in FIG. 20, the aperture 59 and the pixel block shifting member 50 may be arranged adjacent to each other at the conjugate position formed by the lens system 44 and the lens system 46 in the first image-forming optical lens system.

Figure 21:
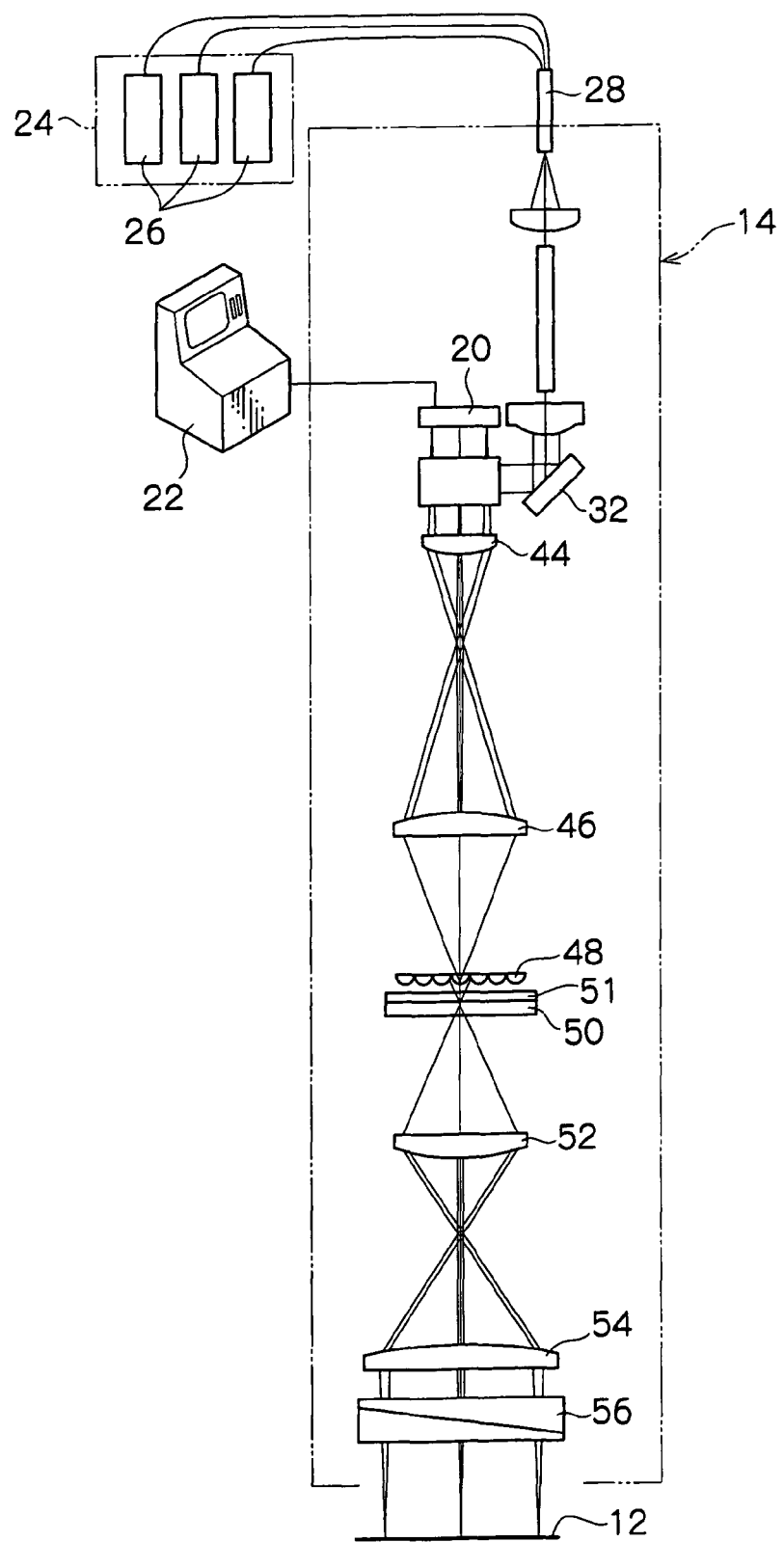
FIG. 21 is a schematic view showing another example of the exposure head unit, in which the pixel block shifting member and the aperture array are arranged adjacent to each other, in the multi-beam exposure apparatus according to the third embodiment.

In the optical projection system of the exposure head 14, as shown in FIG. 21, the aperture 59 and the pixel block shifting member 50 may be arranged adjacent to each other at the rear focal position (front focal position of the second image-forming optical lens system 52) of the micro-lenses in the micro-lens array 36 located at the rear focal position of the lens system 46.

In the optical projection system of the exposure head 14, the diameter of the beam spot (area of the beam spot) and the spot shape which are projected onto the exposure surface of the recording medium 12 are in accordance with the resolution of the exposure pattern when forming the FM screen in the exposed area 18, the scan speed of the exposure head 14, the photosensitive properties of the recording medium 12, and various other conditions (design matters). In consideration of these conditions, the rectangular shape (size, area, horizontal to vertical ratio of an outline shape, or the like) of the beam spot on the recording surface is determined when recording the FM screen.

Therefore, in the optical projection system of the exposure head 14, the reflected light image of the micromirror 36 which is formed at the rear focal position of the lens system 44 (or the micro-lens array 48) is shaped by each aperture 51 such that the beam spot on the recording surface of the recording medium 12 becomes the approximate rectangular shape (size, area, horizontal to vertical ratio of outline shape, or the like) when recording the FM screen.

In the pixel block shifting member 50 used for the exposure head 14 of the image forming apparatus, the number of dots (the number of channels which is the number of beam spots) which can be simultaneously exposed in the direction orthogonal to the scanning direction is increased by effectively utilizing the pixels in the longitudinal direction of the DMD 20 when the exposure process is performed with the DMD 20. The pixel block shifting member 50 is the optical member which enables the recording of a stable halftone expression using the FM screen.

The exposure head 14 is configured such that the light beam projected from the second image-forming optical lens system 52 and 54 is focused onto the recording medium 12 placed on the exposure surface to form the image by the prism pair 56 having an auto-focusing function.

Figure 19:
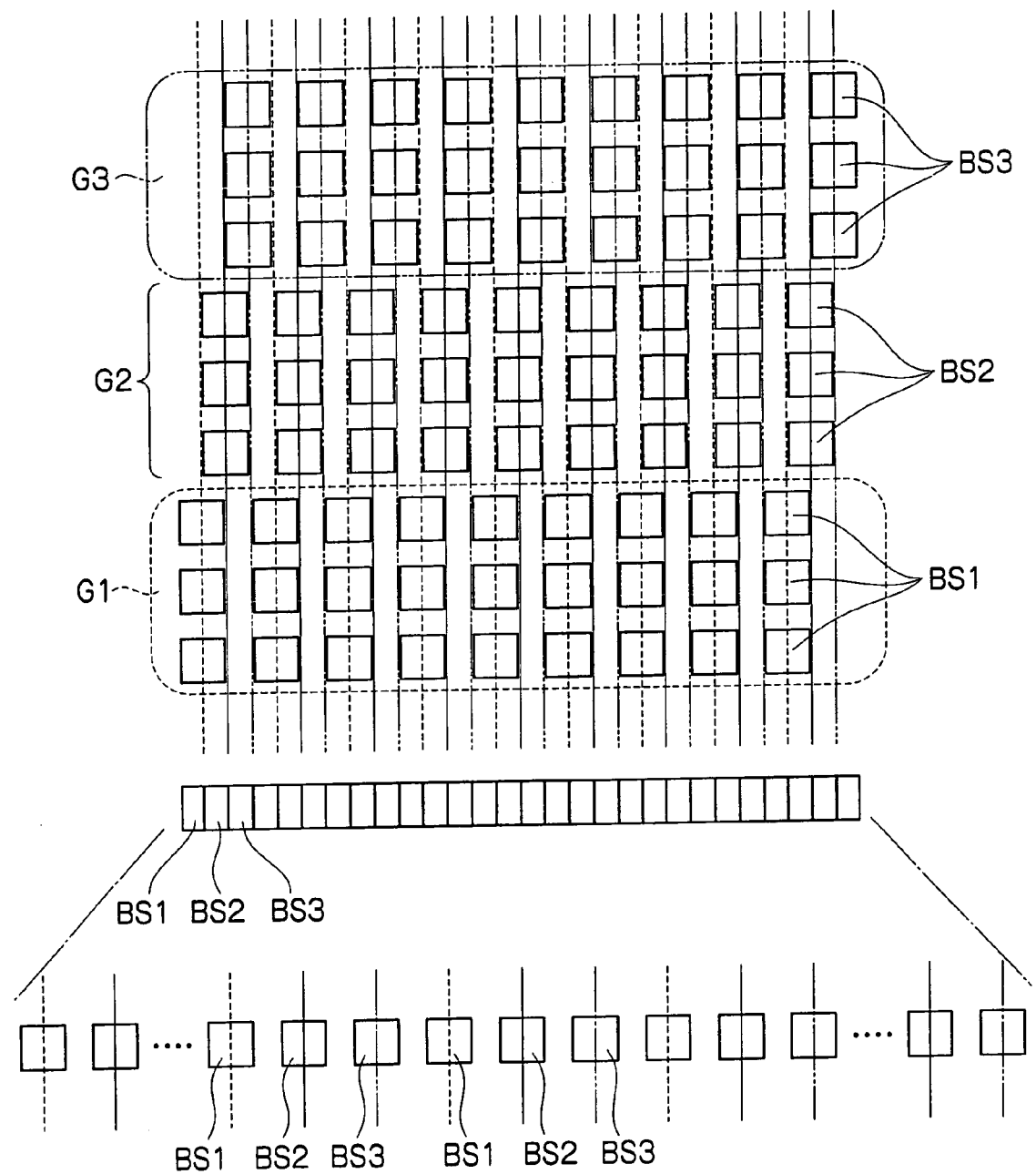
FIG. 19 is a schematic view showing a rectangular beam spot projected onto an exposure surface when performing the exposure using the exposure head according to the third embodiment.

In the exposure head 14, the group of micromirrors 36 is arranged such that the directions of the lattice-shaped array correspond to the scanning direction and the direction orthogonal to the scanning direction. The pixel block shifting member 50 is provided to divide the two-dimensionally arranged group of micromirrors 36 of DMD 20 into three equal sections in the scanning direction on the exposure surface, and the three evenly divided blocks G1, G2, and G3 are set as shown in FIG. 19. In this state, the actions and effects when performing the exposure process onto the recording medium 12 will be described below.

As shown in FIG. 19, when the positions of the first exposure points arranged in the direction orthogonal to the scanning direction are exposed by the exposure head 14, the multiple exposures are performed by the groups of three beam spots BS1 belonging to the block G1. When the positions of the second exposure points (adjacent position to the right in FIG. 19) adjacent to the positions of the first exposure points are exposed by the exposure head 14, the multiple exposures are performed by the groups of three beam spots BS2 belonging to the block G2. When the positions of the third exposure points (next adjacent position to the right in FIG. 19) adjacent to the positions of the second exposure points are exposed by the exposure head 14, the multiple exposures are performed by the groups of three beam spots BS3 belonging to the block G3.

Thus, while the predetermined plural exposure points continuously arranged in the direction orthogonal to the scanning direction are selected to perform the multiple exposures, the recording medium 12 is moved in the scanning direction to perform the exposure process onto the whole of the exposure area in the recording medium 12.

When the exposure process is performed onto the recording medium 12 by the exposure head 14, including the pixel block shifting member 50, while the direction of the lattice-shaped array of the group of micromirrors 36 corresponds to the scanning direction, one dot is formed on the recording medium 12 by performing the exposure plural times at staggered time intervals in the pixels arranged along the main scanning line.

At this point, since the positions of the beam spots in which the multiple exposures are performed in order to record one dot in the recording medium 12 accurately align with one another, the exposure amount distribution in the recorded one dot does not spread in the sub-scanning direction, and the edge of the recorded dot shape can be kept sharp.

In the exposure head 14, as shown in FIG. 19, each beam spot on the recording surface of the recording medium 12 is shaped into the rectangle by each of the apertures 59 of the aperture array 59A, and both sides of the beam spot shaped in the rectangular shape coincides with the scanning direction, so that the edge of the recorded dot shape can be kept sharp. Namely, the edge portion of the exposure amount distribution forming one dot can be sharpened in the sub-scanning direction.

In the exposure head 14, even if one of the apertures 59 is formed in the opening which restricts at least the light spreading in the direction (sub-scanning direction) orthogonal to the scanning direction, the edge portion of the exposure amount distribution forming one dot can be sharpened in the sub-scanning direction.

Accordingly, in the exposure head 14, the FM screen can be recorded with a dot whose edge is further sharpened. Further, a change in density, which is generated by a rapid change in the dot-image ratio (dot-coverage ratio characteristic) due to a change in the circumferential length of the recording pixel, can be prevented. The change in the circumferential length of the recording pixel is caused by the recording conditions such as light power fluctuation and the number of prints, or by the development conditions such as the degree of development of the automatic developing machine. As a result, a stable halftone expression can be recorded when the FM screen is used.

The positions of the plural exposure beam spots projected onto the exposure surface (surface of recording medium 12) from the group of micromirrors 36 may be adjusted by the pixel block shifting member 50 to divide the exposure beam spots into plural blocks on the exposure surface in the scanning direction while the relative position between the blocks is shifted by a predetermined amount in the direction orthogonal to the scanning direction. The plural apertures 59 constituting the aperture array 59A may be arranged so as to adapt to the above state.

Next, the operation of the exposure head of the multi-beam exposure apparatus having the above configuration will be described.

In the multi-beam exposure apparatus, the image data is inputted to the control unit 22 connected to the DMD 20 according to the exposure pattern, and the image data is temporarily stored in a memory in the control unit 22. The image data is one in which the density of each pixel constituting the image is expressed in terms of a binary value (presence or absence of dot recording).

The recording medium 12 is moved at a constant speed from the upstream side to the downstream side in the scanning direction while attached onto the surface of the moving stage (not shown).

When the recording medium 12 on the moving stage passes under the exposure head 14, the plural lines of the image data stored in the memory are sequentially read, and the control signal (control data) is generated based on the read image data by the control device which is the data processing unit. The control signal is compatible with the process of forming the arrangement, in which the two-dimensional arrangement of the exposure beam spots is divided into the plural blocks and shifted by the predetermined distance between the blocks in the direction orthogonal to the scanning direction.

Each of the micromirrors of the DMD 20 placed in the exposure head 14 is on/off-controlled based on the generated control signal. When the control unit 22 is irradiated with the laser beam from the light source unit 24, the laser beam is reflected in the on state of the micromirror of DMD 20, and the exposure is performed by forming the image of the laser beam into the rectangular shape at the required position of the exposure beam spot in which the addressability is improved in the feeding direction.

Since the recording medium 12 is moved at a constant speed along with the moving stage, the recording medium 12 is scanned in the direction opposite to the direction of stage movement by the exposure head 14 to form a belt-shaped exposed area 18.

The multi-beam exposure apparatus of the invention is not limited to the third embodiment, but the multi-beam exposure apparatus of the invention may be formed as the presensitized plate exposure setter. The various modifications can also be made without deviating from the scope of the invention.

What is claimed is:

1. A multi-beam exposure method in which a two-dimensional light modulator is used, and pixels for modulating light are arrayed two-dimensionally in the two-dimensional light modulator, the multi-beam exposure method comprising:

dividing, by a pixel block shifting member, a plurality of two-dimensionally arrayed exposure beam spots into a plurality of blocks with respect to a scanning direction, the plurality of two-dimensionally arrayed exposure beam spots being projected onto an exposure surface from the two-dimensional light modulator such that the plurality of exposure beam spots are arranged in parallel with the scanning direction; and effecting scan-exposing in a state in which a relative position between blocks is shifted by the pixel block shifting member in a direction orthogonal to the scanning direction such that exposure of a space in the direction orthogonal to the scanning direction between the exposure beam spots is carried out with the exposure beam spot of another block.

2. The multi-beam exposure method of claim 1, further comprising forming a beam spot shape by separating the exposure beam into an ordinary ray and an extraordinary ray in which light quantities of the ordinary ray and the extraordinary ray are approximately equal to each other, wherein two beam spots are arranged in the direction orthogonal to the scanning direction while being adjacent to each other so as to partially overlap each other in the beam spot shape.

3. The multi-beam exposure method of claim 2, further comprising emitting the ordinary ray and the extraordinary ray with the light quantities of the ordinary ray and the extraordinary ray being equal to each other.

4. The multi-beam exposure method of claim 1, further comprising restricting spreading of light in each beam spot being focused on the exposure surface in at least the direction orthogonal to the scanning direction, i.e. in a sub-scanning direction.

5. The multi-beam exposure method of claim 4, further comprising forming each beam spot being focused on the exposure surface into a substantially rectangular shape.

6. A multi-beam exposure apparatus, comprising:

a two-dimensional light modulator which is configured to project a plurality of exposure beam spots onto an exposure surface, the plurality of exposure beam spots being arranged in parallel with the scanning direction while being arrayed two-dimensionally; and a pixel block shifting member which projects a plurality of exposure beam spots onto the exposure surface, with dividing the plurality of exposure beam spots emitted from the two-dimensional light modulator into a plurality of blocks in the scanning direction and shifting a relative position between blocks in a direction orthogonal to a scanning direction, and thereby scan-exposing a space in the direction orthogonal to the scanning direction between the exposure beam spots with the exposure beam spot of another block.

7. The multi-beam exposure apparatus of claim 6, wherein the pixel block shifting member has at least a first transparent flat-plate optical member and a second transparent flat-plate optical member, the first optical member is configured to be arranged inclined at a predetermined angle relative to an optical axis of the exposure beams, and thereby a group of the exposure beams are refracted and divided-off into a plurality of blocks and the group of exposure of the beams are projected onto the exposure surface while shifted in the direction orthogonal to the scanning direction, and the second optical member is arranged to be orthogonal to the optical axis of the exposure beams while being adjacent to the first optical member in the scanning direction on an optical path of the exposure beams.

8. The multi-beam exposure apparatus of claim 6, wherein the pixel block shifting member has at least a first transparent flat-plate optical member and a second transparent flat-plate optical member, the first optical member is configured to be positioned inclined at a first predetermined angle relative to the optical axis of the exposure beams, and thereby a first group of the exposure beams are refracted and divided-off into the first block and a first group of exposure beams are projected onto the exposure surface while shifted in a first direction orthogonal to the scanning direction, and the second optical member is configured to be positioned inclined at a second predetermined angle relative to the optical axis of the exposure beams, and thereby a second group of the exposure beams are refracted and divided-off into a second block and the second group of the exposure beams is projected onto the exposure surface while shifted in a second direction orthogonal to the scanning direction.

9. The multi-beam exposure apparatus of claim 6, wherein the pixel block shifting member has at least one diffraction member and a transparent unit, the transparent unit being arranged adjacent to the diffraction member in the scanning direction on the optical path of the exposure beams, the diffraction member is configured to diffract a group of the exposure beams and divide-off the group of the exposure beams into at least one block, and thereby the group of exposure beams are projected onto the exposure surface while shifted in a direction orthogonal to the scanning direction, and the transparent unit is configured to transmit some of the exposure beams along a linear optical path.

10. The multi-beam exposure apparatus of claim 6, wherein the pixel block shifting member has a first diffraction member and a second diffraction member, the first diffraction member is configured to diffract a first group of exposure beams and divide-off the group of the exposure beams into a first block, such that the first group of the exposure beams are projected onto the exposure surface while shifted in a direction orthogonal to the scanning direction, and the second diffraction member is configured to diffract a second group of the exposure beams and divide-off the second group of the exposure beams into a second block, such that the second group of exposure beams are projected onto the exposure surface while shifted in the opposite direction orthogonal to the scanning direction.

11. The multi-beam exposure apparatus of claim 6, wherein the pixel block shifting member has at least one polarization unit and a transparent unit, the transparent unit being positioned adjacent to the polarization unit in the scanning direction on the optical path of the exposure beams, the polarization unit is configured to transmit a group of the exposure beams and divides-off the group of the exposure beams into at least one block, and thereby extraordinary rays are projected onto the exposure surface, the extraordinary rays being emitted while shifted in the direction orthogonal to the scanning direction, and the transparent unit is configured to transmit some of the exposure beams along a linear optical path.

12. The multi-beam exposure apparatus of claim 6, wherein the pixel block shifting member has a first polarization unit and a second polarization unit, the first polarization unit is configured to transmit a first group of the exposure beams and divides-off the first group of the exposure beams into a block, and thereby the extraordinary rays are projected onto the exposure surface, the extraordinary ray being emitted while shifted in a direction orthogonal to the scanning direction, and the second polarization unit is configured to transmit a second group of the exposure beams and divides-off the second group of the exposure beams into a second block, and thereby other extraordinary rays are projected onto the exposure surface, these extraordinary rays being emitted while shifted in the opposite direction orthogonal to the scanning direction.

13. The multi-beam exposure apparatus of claim 6, further comprising a uniaxial crystal optical element which is arranged in an optical projection system of the multi-beam exposure apparatus, between the pixel block shifting member and the exposure surface, the uniaxial crystal optical element forming a beam spot shape by separating the exposure beams into an ordinary ray and an extraordinary ray with light quantities of the ordinary ray and the extraordinary ray being approximately equal to each other, such that two beam spots are arranged in the direction orthogonal to the scanning direction while being adjacent to each other so as to partially overlap each other in the beam spot shape.

14. The multi-beam exposure apparatus of claim 13, wherein the pixel block shifting member is formed as an optical element utilizing light polarization, and a polarization adjuster is further provided between the pixel block shifting member and the uniaxial crystal optical element, the polarization adjuster causing the ordinary ray and the extraordinary ray to be emitted from the uniaxial crystal optical element with substantially equal light quantities.

15. The multi-beam exposure apparatus of claim 6, further comprising an optical projection system and an aperture which is arranged in an optical projection system, the optical projection system focusing the plurality of exposure beams emitted from the two-dimensional light modulator, onto the exposure surface, the aperture being formed as an opening which at least restricts light extending in the direction orthogonal to the scanning direction, i.e. in a sub-scanning direction in each beam spot, the beam spot being focused onto the exposure surface.

16. The multi-beam exposure apparatus of claim 15, wherein the aperture is formed in substantially a rectangular shape.

17. The multi-beam exposure apparatus of claim 15 or 16, wherein a plurality of apertures are arranged at a position conjugate with a plane of the two-dimensional light modulator in the optical projection system.

18. The multi-beam exposure apparatus of claim 15, wherein a micro-lens array is positioned at the position conjugate with the plane of the two-dimensional light modulator in the optical system and the aperture is arranged at a focal position of micro-lenses or at the position conjugate with the micro-lens focal points.

* * * * *